United States Patent
Kitamura

(10) Patent No.: US 8,183,586 B2
(45) Date of Patent: May 22, 2012

(54) ORGANIC ELECTROLUMINESCENCE DEVICE AND LUMINESCENCE APPARATUS

(75) Inventor: Yoshitaka Kitamura, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 231 days.

(21) Appl. No.: 12/690,945

(22) Filed: Jan. 21, 2010

(65) Prior Publication Data

US 2010/0193820 A1     Aug. 5, 2010

(30) Foreign Application Priority Data

Jan. 23, 2009   (JP) ................................. 2009-013549

(51) Int. Cl.
*H01L 33/00*      (2010.01)

(52) U.S. Cl. ...................... 257/97; 257/98; 257/E33.061

(58) Field of Classification Search .................... 257/98, 257/97, E33.061
See application file for complete search history.

(56) References Cited

U.S. PATENT DOCUMENTS

| | | | | |
|---|---|---|---|---|
| 6,905,788 B2 * | 6/2005 | Tyan et al. | ..................... | 428/690 |
| 6,991,859 B2 * | 1/2006 | Klubek et al. | ................ | 428/690 |
| 7,192,659 B2 * | 3/2007 | Ricks et al. | .................... | 428/690 |
| 2005/0058852 A1 * | 3/2005 | Tyan et al. | ..................... | 428/690 |
| 2005/0249972 A1 * | 11/2005 | Hatwar et al. | ................ | 428/690 |
| 2005/0260439 A1 * | 11/2005 | Shiang et al. | ................. | 428/690 |
| 2008/0093608 A1 * | 4/2008 | Chik et al. | ....................... | 257/89 |
| 2009/0261360 A1 * | 10/2009 | Yasukawa et al. | .............. | 257/89 |
| 2011/0068361 A1 * | 3/2011 | Li et al. | ............................ | 257/98 |
| 2011/0101388 A1 * | 5/2011 | Nomura | .......................... | 257/89 |
| 2011/0156059 A1 * | 6/2011 | Reineke et al. | ................. | 257/79 |

FOREIGN PATENT DOCUMENTS

| | | |
|---|---|---|
| JP | 2000-340361 A | 12/2000 |
| JP | 2003-187977 A | 7/2003 |

* cited by examiner

*Primary Examiner* — Victor A Mandala

(74) *Attorney, Agent, or Firm* — SOLARIS Intellectual Property Group, PLLC

(57) ABSTRACT

The invention provides an organic EL device including an anode, a cathode, and a luminescent portion positioned between the anode and cathode, the luminescent portion including two or more luminescent layers, each of the luminescent layers including plural primary luminescent layers that emit light of different colors, and each of the primary luminescent layers having a thickness of 5 nm or less.

14 Claims, 1 Drawing Sheet

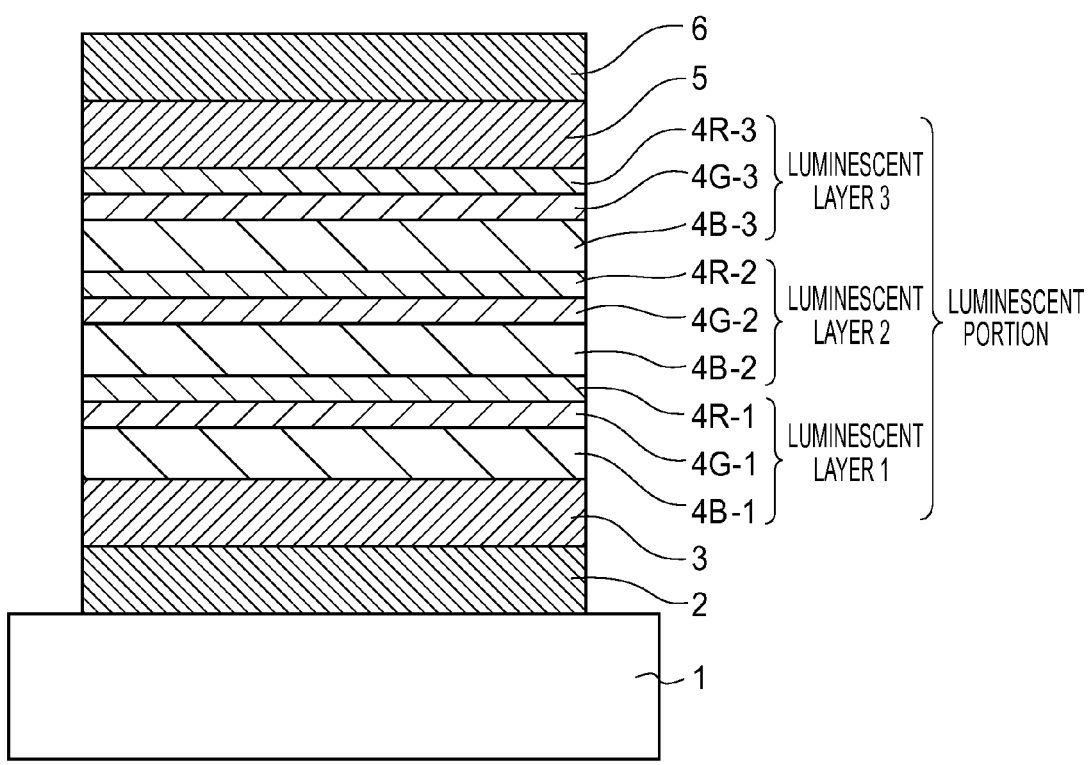

ORGANIC ELECTROLUMINESCENCE DEVICE AND LUMINESCENCE APPARATUS

CROSS-REFERENCE TO RELATED APPLICATION

This application claims priority under 35 USC 119 from Japanese Patent Application No. 2009-013549 filed Jan. 23, 2009, the disclosure of which is incorporated by reference herein.

TECHNICAL FIELD

The present invention relates to an organic electroluminescence device (organic EL device).

BACKGROUND ART

Organic EL devices are a device employing a film material that emits light when excited by applying a current thereto. Since organic EL devices emit highly bright light at low voltage, these devices have a wide variety of potential applications including a cellular phone display, a personal digital assistant (PDA), a computer display, an information display of a car, a TV monitor, illuminating devices, and the like, and have such advantages as reducing the thickness or weight of these items or saving energy to operate them. Therefore, organic EL devices are expected to play a leading part in the future electronic device market. However, in order to practically apply these items employing an organic EL device instead of conventional displays, the brightness, color tone, endurance in various environmental conditions, or production cost or amount of the organic EL devices, have yet to be improved.

One characteristic of an organic EL device is that light of various colors can be produced by mixing light of plural colors.

In particular, there is a high demand for organic EL devices that emit white light, which may contribute to reduce energy consumption of illuminating devices, and are usable as an in-car display or a backlight. Further, by splitting its white light into blue, green and red pixels using a color filter, the organic EL devices that emit white light can also be used in full-color display devices.

On the other hand, since there are few materials that white light per se, combining plural materials that emit light of different colors, i.e., having different levels of exciton energy, is typically conducted to produce white light. In this case, as a result of using plural luminescent materials having different levels of exciton energy, transfer of energy from a material having a higher exciton energy to a material having a lower exciton energy is known to occur, and this may cause extinction or change of color of the light.

In order to address this problem, a method of isolating the luminescent materials from each other is proposed to prevent the energy transfer among them so that each luminescent material can emit the predetermined light.

For example, Japanese Patent Application Laid-Open (JP-A) No. 2000-340361 proposes a method of depositing luminescent materials that emit light of different colors on a substrate to a thickness of 4 nm or less in the form of islands or stripes. In this method, however, there are technical difficulties in uniformly distributing the luminescent materials that emit light of different colors in the form of islands within a plane. Alternatively, if the luminescent layer is formed simply in the form of stripes, there is a fear that the transfer of energy among the adjacent layers may occur. Moreover, if the luminescent layer is extremely thin, durability of the luminescent layer may deteriorate due to the concentration of charges or electric fields thereto.

JP-A No. 2003-187977 proposes a method of producing white light by mixing light of different colors, by forming a three-layer structure in which a luminescent layer that emits light of a short wavelength is sandwiched by two luminescent layers that emit light of a long wavelength.

However, in such a structure as above in which luminescent layers that emit light of different colors (having different energy levels) are simply layered, further improvements are still to be made to address the problem of color change, which is caused by the change of location at which electrons and holes are recombined to emit light, due to the change of voltage applied to the device or the like.

In view of the above, the present invention provides an organic EL device that emits light of mixed colors with suppressed change in chromaticity caused by displacement of the location for light emission. In particular, the present invention provides an organic EL device that can be produced by a simple process and emits white light by combining three colors of luminescent devices having different luminescence peaks, such as blue, green and red, while suppressing the displacement of the location for light emission due to changes in driving voltage.

SUMMARY OF THE INVENTION

In view of the above circumstances, an aspect of the present invention provides an organic EL device comprising an anode, a cathode, and a luminescent portion positioned between the anode and cathode, the luminescent portion comprising two or more luminescent layers, each of the luminescent layers comprising plural primary luminescent layers that emit light of different colors, and each of the primary luminescent layers having a thickness of 5 nm or less.

BRIEF DESCRIPTION OF THE DRAWING

FIG. 1 is a schematic sectional view showing the layer structure of an exemplary embodiment of organic EL device of the invention.

DETAILED DESCRIPTION OF THE INVENTION

Structure

The organic EL device of the invention includes an anode, a cathode, and a luminescent portion positioned between the anode and cathode, the luminescent portion comprising two or more luminescent layers, each of the luminescent layers comprising plural primary luminescent layers that emit light of different colors, and each of the primary luminescent layers having a thickness of 5 nm or less.

In view of the characteristics of a luminescence device, at least one of the pair of electrodes is preferably transparent.

Further, the organic EL device of the invention preferably includes a hole-injection layer between the hole-transporting layer and the anode, and/or a hole-transporting intermediate layer between the luminescent portion and the hole-transporting layer.

Moreover, the organic EL device of the invention preferably includes an electron-transporting intermediate layer between the luminescent portion and the electron-transporting layer, and/or an electron-injection layer between the cathode and the electron-transporting layer.

Preferred embodiments of the organic compound layer of the organic EL device of the invention include the following structures (1) to (3).

(1) hole-injection layer/hole-transporting layer/hole-transporting intermediate layer/luminescent portion/electron-transporting layer/electron-injection layer (2) hole-injection layer/hole-transporting layer/luminescent portion/electron-transporting intermediate layer/electron-transporting layer/electron-injection layer (3) hole-injection layer/hole-transporting layer/hole-transporting intermediate layer/luminescent portion/electron-transporting intermediate layer/electron-transporting layer/electron-injection layer In each of the above embodiments, a single layer may serve as a hole-injection layer and a hole-transporting layer, or a single layer may serve as an electron-transporting layer and an electron-injection layer.

The hole-transporting intermediate layer preferably has at least one function of promoting the injection of holes to the luminescent portion, or blocking the electrons from the luminescent portion.

The electron-transporting intermediate layer preferably has at least one function of promoting the injection of electrons to the luminescent portion, or blocking the holes from the luminescent portion.

Moreover, at least one of the hole-transporting intermediate layer or the electron-transporting intermediate layer preferably has a function of blocking the excitons generated in the luminescent portion.

In order to effectively achieve the functions of these layers, such as the promotion of hole injection, promotion of electron-injection, blocking of the holes, blocking of the electrons, or blocking of the excitons, the hole-transporting intermediate layer and the electron-transporting intermediate layer are preferably located adjacent to the luminescent portion.

Further, each of these layers may include plural secondary layers.

Next, the structure of organic EL device of the invention will be described in detail.

The organic EL device of the invention includes a pair of electrodes (anode and cathode) and a luminescent portion located between the pair of electrodes, and the luminescent portion includes two or more luminescent layers. Each of the luminescent layers includes plural primary luminescent layers that emit light of different colors. Moreover, each of the primary luminescent layers has a thickness of 5 nm or less.

Preferably, the plural primary luminescent layers of different colors are located adjacent to each other in each of the luminescent layers.

Preferably, the luminescent portion emits white light as a result of mixing the colors of light emitted from the plural primary luminescent layers of different colors.

Preferably, in each of the luminescent layers, the primary luminescent layer including a luminescent material that emits light of the shortest wavelength (hereinafter, referred to as the primary luminescent layer of the shortest wavelength) is at least twice as thick as, more preferably at least three times as thick as, the primary luminescent layer including a luminescent material that emits light of the longest wavelength (hereinafter, referred to as the primary luminescent layer of the longest wavelength).

When the primary luminescent layer is as thin as 5 nm or less, transfer of energy may easily occur from the primary luminescent layer of the shortest wavelength to the primary luminescent layer of the longest wavelength. Therefore, it is not preferred to include an excessive amount of luminescent material in the primary luminescent layer of the longest wavelength. Accordingly, the primary luminescent layer of the shortest wavelength is preferably at least twice as thick as the primary luminescent layer of the longest wavelength. However, when the thickness of primary luminescent layer of the shortest wavelength is 20 or more times the thickness of the primary luminescent layer of the longest wavelength, the thickness of the primary luminescent layer of the longest wavelength needs to be extremely thin, i.e., as thin as about 0.3 nm, thereby making it difficult to control the thickness of the layer. In view of the above, the primary luminescent layer of the shortest wavelength is preferably from twice to 20 times as thick as the primary luminescent layer of the longest wavelength.

Preferably, each of the plural primary luminescent layer that emit light of different colors independently include at least a luminescent material and a host material, and the concentration of the luminescent material in the primary luminescent layer of the shortest wavelength is preferably at least twice as high as the concentration of the luminescent material in the primary luminescent layer of the longest wavelength. Moreover, the concentration of the luminescent material in the primary luminescent layer of the shortest wavelength is preferably at least 10 times, more preferably at least 15 times, and further preferably at least 30 times as high as the concentration of the luminescent material in the primary luminescent layer of the longest wavelength.

Preferably, in each of the luminescent layers, the primary luminescent layer of the shortest wavelength is at least twice as thick as the primary luminescent layer of the longest wavelength, and the concentration of the luminescent material in the primary luminescent layer of the shortest wavelength is at least twice as high as the concentration of the luminescent material of the primary luminescent layer of the longest wavelength.

When the thickness of the primary luminescent layer of the shortest wavelength is less than twice the thickness of the primary luminescent layer of the longest wavelength, the concentration of the luminescent material in the primary luminescent layer of the shortest wavelength is preferably at least 10 times, more preferably at least 30 times, and further preferably at least 100 times as high as the concentration of the luminescent material in the primary luminescent layer of the longest wavelength.

Further, when the primary luminescent layer of the shortest wavelength is from twice to 2.5 times as thick as the primary luminescent layer of the longest wavelength, the concentration of the luminescent material in the primary luminescent layer of the shortest wavelength is preferably at least 3 times, more preferably at least 5 times, and further preferably at least 15 times as high as the concentration of the luminescent material in the primary luminescent layer of the longest wavelength.

Moreover, when the primary luminescent layer of the shortest wavelength is more than 2.5 times to 4 times as thick as the primary luminescent layer of the longest wavelength, the concentration of the luminescent material in the primary luminescent layer of the shortest wavelength is preferably at least twice, more preferably at least 3 times, and further preferably at least 5 times as high as the concentration of the luminescent material in the primary luminescent layer of the longest wavelength.

When the thickness of the primary luminescent layer of the shortest wavelength is more than 4 times the thickness of the primary luminescent layer of the longest wavelength, the concentration of the luminescent material in the primary luminescent layer of the shortest wavelength is preferably at least twice as high as the concentration of the luminescent material in the primary luminescent layer of the longest wavelength.

When each of the luminescent layers includes three or more kinds of primary luminescent layer, the primary luminescent layer other than the luminescent layer of the shortest wavelength or the luminescent layer of the longest wavelength preferably has a thickness and a concentration of a luminescent material within the range between the thicknesses and the concentrations of the luminescent layer of the shortest wavelength and the luminescent layer of the longest wavelength.

Preferably, the luminescent portion includes four or more, more preferably six or more, luminescent layers each including plural primary luminescent layers that emit light of different colors.

Preferably, the luminescent layers each include at least a red primary luminescent layer, a green primary luminescent layer, and a blue primary luminescent layer.

Preferably, the red primary luminescent layer, the green primary luminescent layer, and the blue primary luminescent layer each include a luminescent material and a host material, and the concentration of the luminescent material in the blue primary luminescent layer is at least 10 times as high as the concentration of the luminescent material in the red primary luminescent layer.

Preferably, the red primary luminescent layer, the green primary luminescent layer, and the blue primary luminescent layer each include a luminescent material and a host material, the blue primary luminescent layer being at least twice as thick as the red primary luminescent layer, and the concentration of the luminescent material in the blue primary luminescent layer being at least 10 times as high as the concentration of the luminescent material in the red primary luminescent layer.

Preferably, at least one of the luminescent materials is a metal complex that emits phosphorescent light.

Exemplary arrangements of the red primary luminescent layer, the green primary luminescent layer and the blue primary luminescent layer in each of the luminescent layers include: (1) blue primary luminescent layer/green primary luminescent layer/red primary luminescent layer; (2) blue primary luminescent layer/red primary luminescent layer/blue primary luminescent layer/green primary luminescent layer/blue primary luminescent layer; and (3) blue primary luminescent layer/green-and-red mixed primary luminescent layer/blue primary luminescent layer.

The organic EL device of the invention may have a resonator structure.

In one exemplary resonator structure, the organic EL device includes, on a transparent substrate, a multilayer mirror formed from multiple layers having different refractive indexes, a transparent or semi-transparent electrode, a luminescent portion, and a metal electrode. Light generated at the luminescent portion resonates by repeating reflection between the multilayer mirror and the metal electrode serving as the reflectors.

In another exemplary resonator structure, the organic EL device includes, on a transparent substrate, a transparent or semi-transparent electrode, a luminescent portion, and a metal electrode, and the light generated at the luminescent portion resonates by repeating reflection between the transparent or the semi-transparent electrode and the metal electrode serving as the reflectors.

In order to form a resonator structure, the optical path length, which is determined by the effective refractive indexes of the two reflectors, refractive indexes and the thicknesses of each of the layers positioned between the reflectors, is adjusted to an optimal value so as to obtain a desired resonance wavelength.

The optimal value of the optical path length in the case of the former exemplary structure can be calculated from the expression described in JP-A No. 9-180883, and the optimal value of the optical path length in the case of the latter exemplary structure can be calculated from the expression described in JP-A No. 2004-127795.

Each of the layers that constitute the organic compound layer may be suitably formed by any of a dry method such as evaporation or sputtering, or by a wet method such as a transfer method, a print method, an application method, an inkjet method, and a spray method.

In the following, each component that forms the organic EL device of the invention will be described in detail.

(Luminescent Portion)

The luminescent portion functions, when an electric field is applied thereto, to receive holes from the anode, the hole injection layer, the hole-transporting layer or the electron-transporting intermediate layer; receive electrons from the cathode, the electron-injection layer, the electron-transporting layer or the electron-transporting intermediate layer; and provide a place for the holes and the electrons to recombine with each other and emit light.

The luminescent portion of the invention includes two or more luminescent layers each including plural primary luminescent layers that emit light of different colors. The number of the luminescent layers is preferably four or more, more preferably six or more, and yet more preferably eight or more.

FIG. 1 is a schematic view of an exemplary layered structure of the organic EL device of the invention that includes, on substrate 1, anode 2, hole-transporting layer 3 and a luminescent portion. The luminescent portion includes luminescent layer 1 that includes blue primary luminescent layer 4B-1, green luminescent layer 4G-1, and red primary luminescent layer 4R-1; luminescent layer 2 that includes blue primary luminescent layer 4B-2, green luminescent layer 4G-2, and red primary luminescent layer 4R-2; and luminescent layer 3 that includes blue primary luminescent layer 4B-3, green luminescent layer 4G-3, and red primary luminescent layer 4R-3.

The composition of blue primary luminescent layer 4B-1, 4B-2 and 4B-3 may be the same or different; the composition of green primary luminescent layer 4G-1, 4G-2 and 4G-3 may be the same or different; and the composition of red primary luminescent layer 4R-1, 4R-2 and 4R-3 may be the same or different.

Preferably, the thickness of the blue primary luminescent layer is more than that of the green primary luminescent layer or the red primary luminescent layer.

Preferably, the blue primary luminescent layer is at least twice, more preferably at least three times, and further preferably at least five times as thick as the red primary luminescent layer.

Preferably, each of the primary luminescent layers independently includes at least a luminescent material and a host material, and the concentration of the luminescent material in the blue primary luminescent layer is higher than that of the green and red primary luminescent layers. Preferably, the concentration of the luminescent material in the blue primary luminescent layer is at least twice, more preferably at least 10 times, still more preferably at least 15 times, and most preferably at least 30 times as high as the concentration of the luminescent material in the red primary luminescent layer.

Preferably, the blue primary luminescent layer has a thickness of at least twice the thickness of the red primary luminescent layer, and a concentration of the luminescent material of at least twice the concentration of the luminescent material in the red primary luminescent layer.

Over the luminescent portion, electron-transporting layer 5 and cathode 6 are formed. When an electric current is applied to the organic EL device having the above structure, the device emits white light as a result of mixing of the light of blue, green and red, emitted from each of the primary luminescent layers.

The concentration of the luminescent material with respect to the total mass of the compounds in each primary luminescent layer is preferably from 0.1% by mass to 30% by mass, more preferably from 1% by mass to 15% by mass, from the viewpoint of durability or external quantum efficiency of the organic EL device.

The concentration of the host material with respect to the total mass of the compounds in each primary luminescent layer is preferably from 70% by mass to 99.9% by mass, more preferably from 85% by mass to 99% by mass, from the viewpoint of durability or external quantum efficiency of the organic EL device.

<Thickness>

The thickness of the luminescent portion is preferably from 10 nm to 200 nm, more preferably from 20 nm to 60 nm, from the viewpoint of driving voltage or durability of the organic EL device.

The thickness of each primary luminescent layer is 5 nm or less, preferably from 0.1 nm to 3.0 nm, more preferably from 0.3 nm to 2.0 nm, from the viewpoint of achieving similar degrees of surface roughness and thickness of the primary luminescent layer.

When the thickness of the luminescent portion is too small, the device can be driven at high brightness at low voltage. However, the resistance of the device may decrease and the device may become more susceptible to the changes in brightness due to the voltage reduction, thereby exaggerating the unevenness in brightness. On the other hand, when the luminescent portion is too thick, the driving voltage needs to be increased and the luminescent efficiency may deteriorate, and therefore the applications of the device may be limited.

When the thickness of the primary luminescent layer is too small, it may be difficult to regulate the thickness thereof. On the other hand, when the primary luminescent layer is too thick, the thickness for suppressing color deviation may be increased, thereby causing a voltage increase.

<Luminescent Material>

Known luminescent materials include fluorescent materials and phosphorescent materials. In the invention, phosphorescent materials are preferably used in view of the luminescence efficiency of the organic EL device. Since phosphorescent materials have a long exciton lifetime, transfer of energy is more likely to occur in the system when different kinds of luminescent material are used together. Therefore, the effect of the invention is expected to be more significant when phosphorescent materials are used, as compared with the cases in which fluorescent materials are used.

<Phosphorescent Material>

Exemplary phosphorescent materials used in the present invention include a complex including a transition metal atom or a lanthanoid atom.

Preferable examples of the transition metal atom include, but not particularly limited to, ruthenium, rhodium, palladium, tungsten, rhenium, osmium, iridium and platinum. Among these, rhenium, iridium and platinum are more preferred, and iridium and platinum are yet more preferred.

Examples of the ranthanoid atom include lanthanum, cerium, praseodymium, neodymium, samarium, europium, gadolinium, terbium, dysprosium, holmium, erbium, thulium, ytterbium, and lutetium. Among these, neodymium, europium and gadolinium are preferred.

Exemplary ligands for the complex are described in G. Wilkinson et al., Comprehensive Coordination Chemistry, published by Pergamon Press (1987); H. Yersin et al., Photochemistry and Photophysics of Coordination Compounds, published by Springer-Verlag (1987); and Akio Yamamoto, Organometallic Chemistry—Basics and Applications—, published by Shokabo Publishing Co., Ltd. (1982).

Specific examples of the ligand preferably include halogen ligands (preferably a chlorine ligand), aromatic carbon ring ligands (such as a cyclopentadienyl anion, a benzene anion or a naphthyl anion), nitrogen-containing heterocycle ligands (such as phenylpyridine, benzoquinoline, quinolinol, bipyridyl and phenanthroline), diketone ligands (such as acetylacetone), carboxylic acid ligands (such as acetic acid ligands), alcholate ligands (such as phenolato ligands), carbon monoxide ligands, isonitrile ligands, and cyano ligands. Among these, nitrogen-containing heterocycle ligands are more preferred.

The complex as mentioned above may have one metal atom therein, or may form a so-called polynuclear complex including two or more metal atoms. The complex may include different kinds of metal atoms.

Among these, specific examples of the phosphorescent material include the compounds described in U.S. Pat. No. 6,303,238, U.S. Pat. No. 6,097,147, WO00/57676, WO00/70655, WO01/08230, WO01/39234, WO01/41512, WO02/02714, WO02/15645, WO02/44189, JP-A No. 2001-247859, JP-A No. 2002-302671, JP-A No. 2002-117978, JP-A No. 2002-225352, JP-A No. 2002-235076, JP-A No. 2003-123982, JP-A No. 2002-170684, EP 1211257, JP-A No. 2002-226495, JP-A No. 2002-234894, JP-A No. 2001-247859, JP-A No. 2001-298470, JP-A No. 2002-173674, JP-A No. 2002-203678, JP-A No. 2002-203679, JP-A No. 2004-357791, JP-A No. 2006-256999, and JP-A 2005-75341.

The following are specific examples of the phosphorescent material that may be used in the invention, but the invention is not limited thereto.

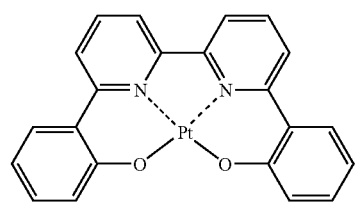

(1)

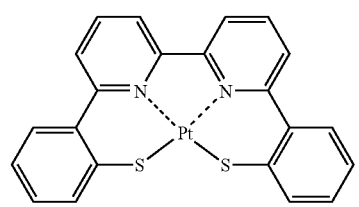

(2)

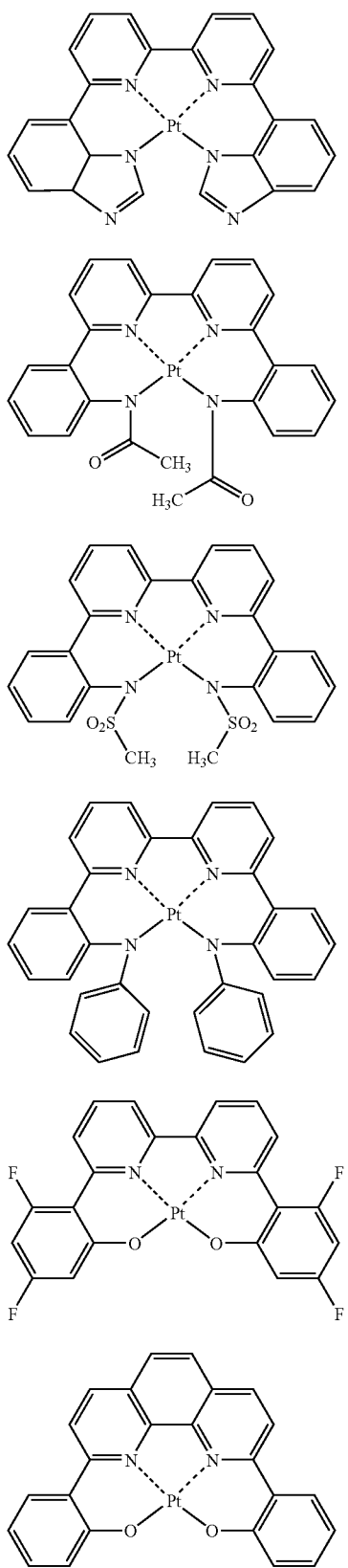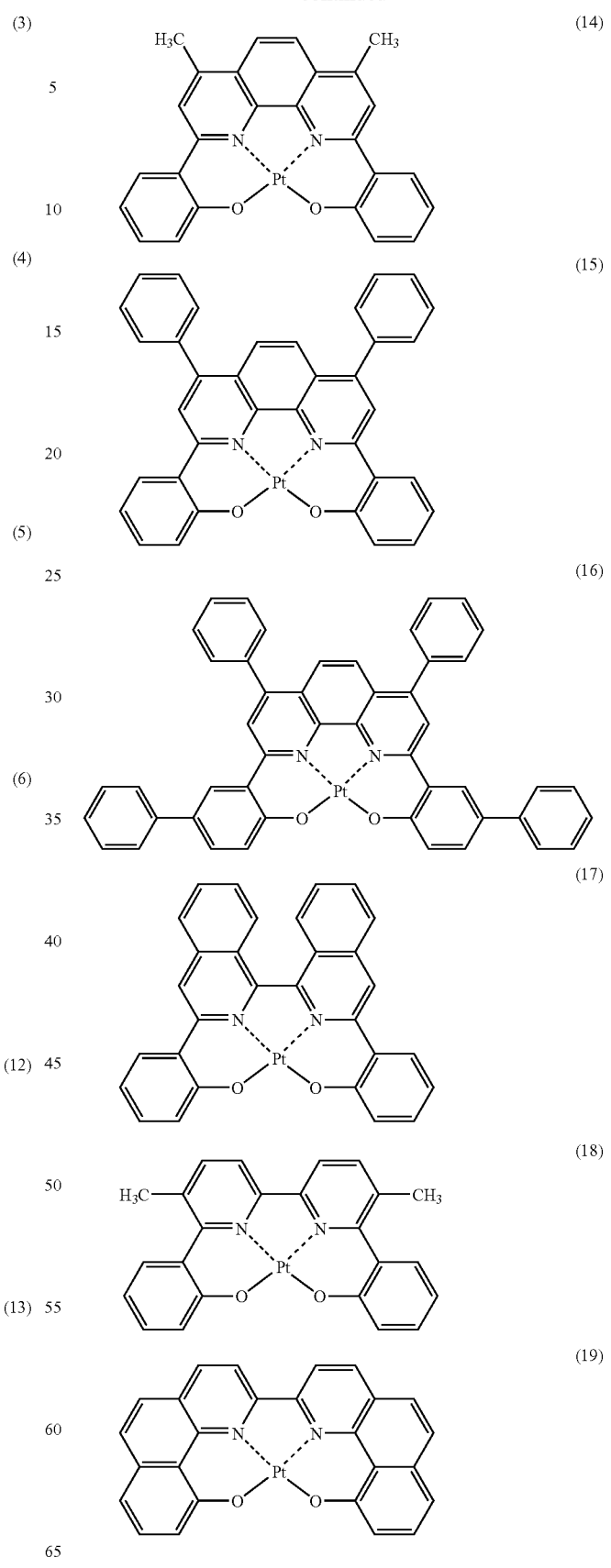

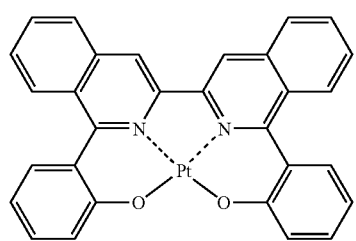
(20)
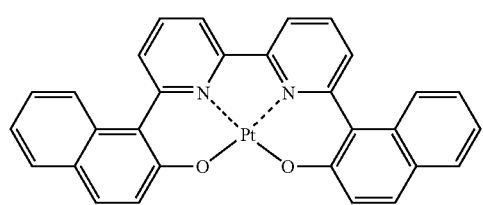
(21)
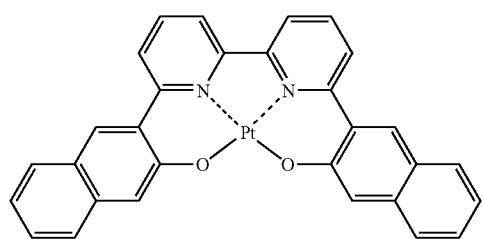
(22)
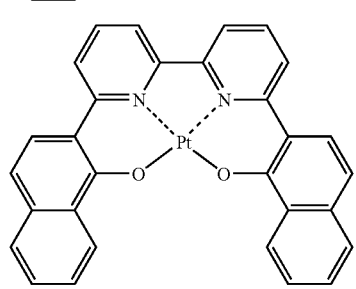
(23)
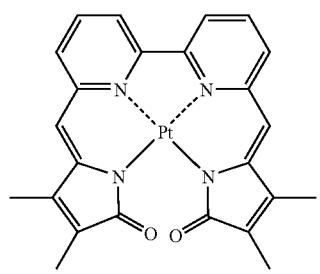
(24)
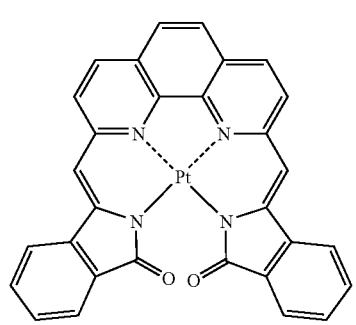
(25)
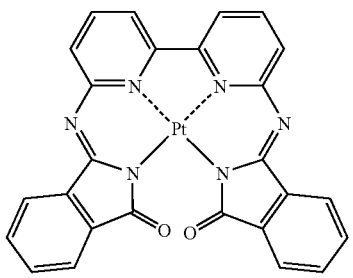
(26)
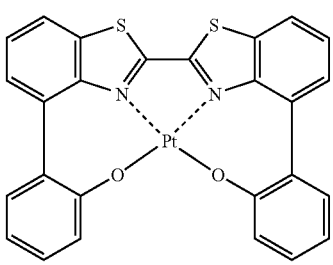
(27)
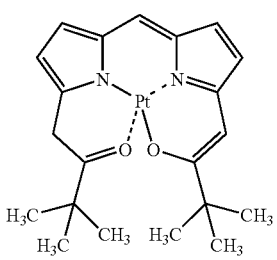
(28)
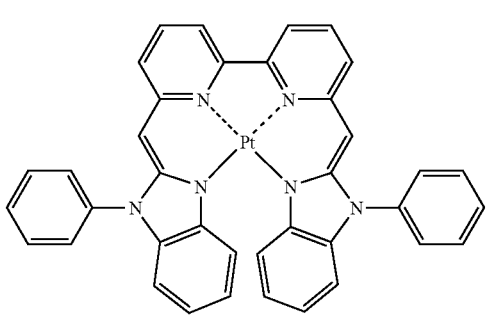
(29)
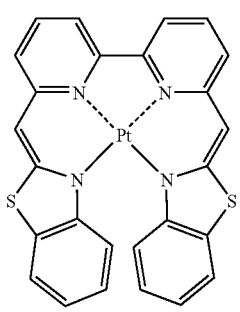
(30)

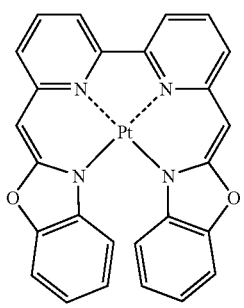
(31)
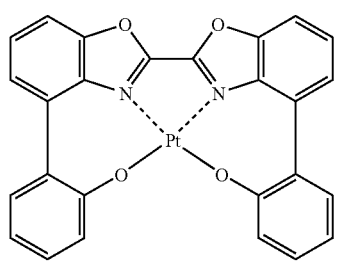
(32)
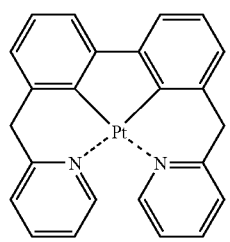
(33)
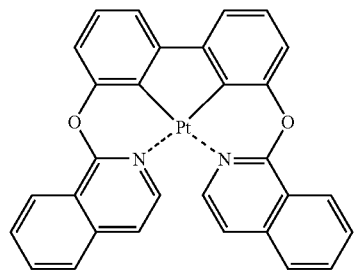
(34)
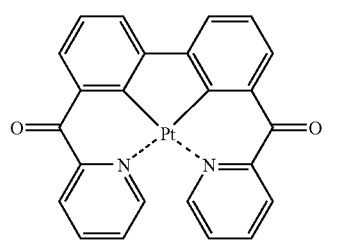
(35)
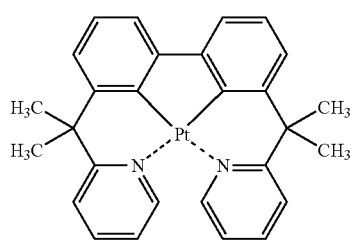
(36)
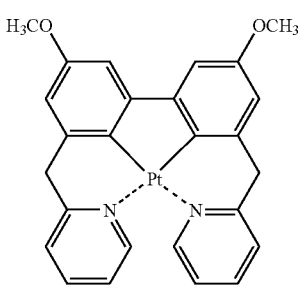
(37)
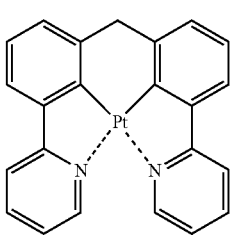
(38)
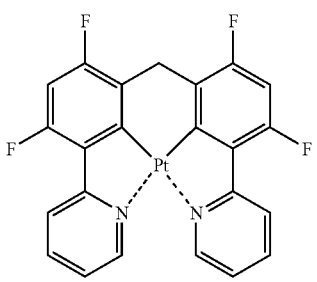
(39)
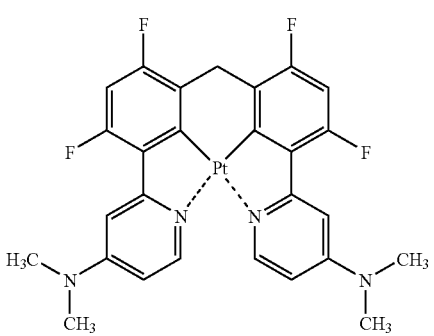
(40)
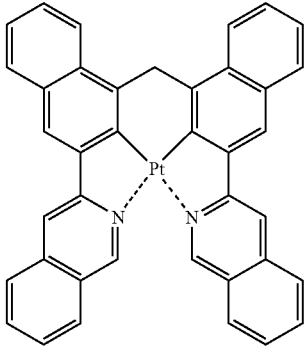
(41)

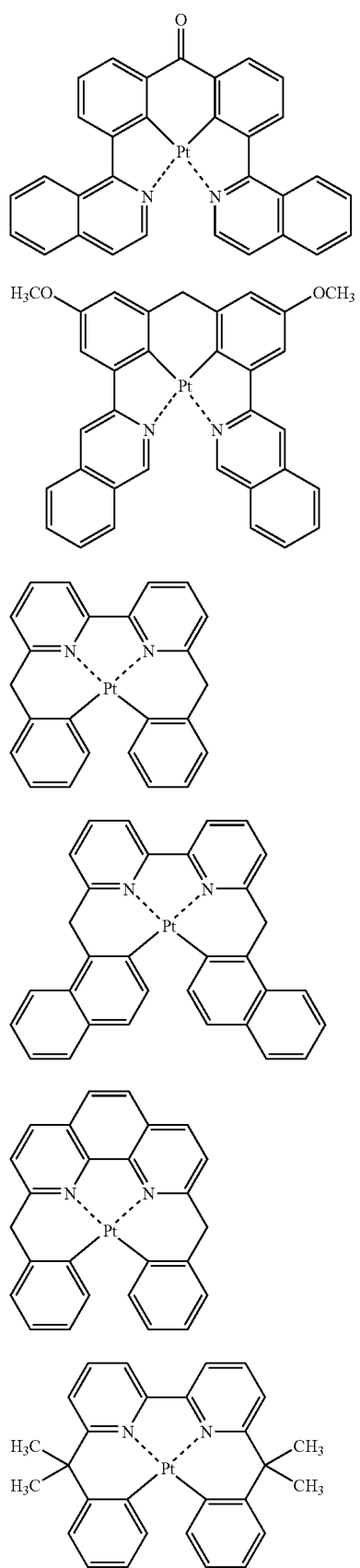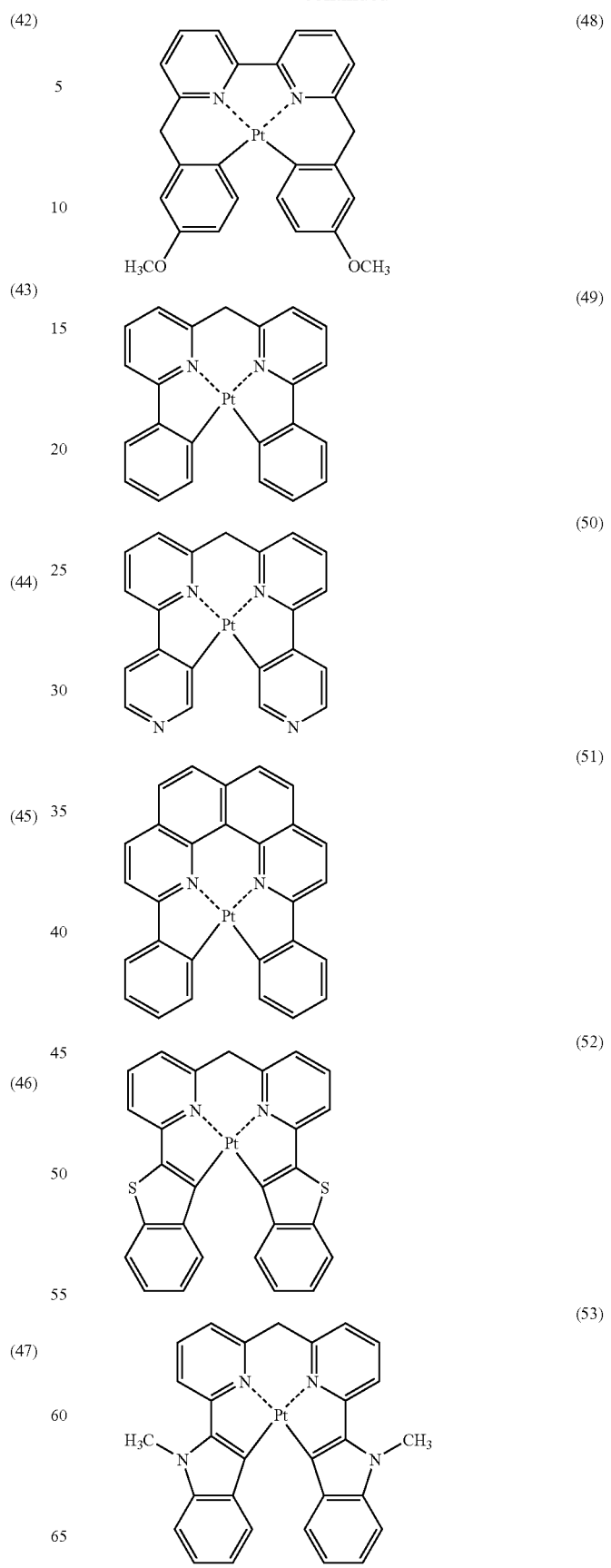

(54) 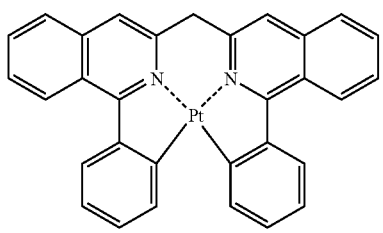
(55) 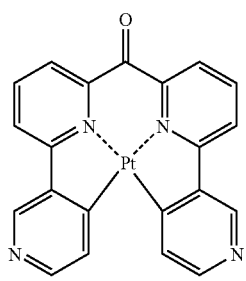
(56) 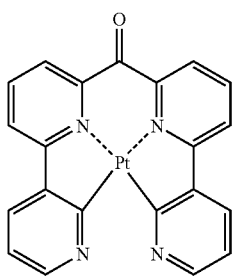
(57) 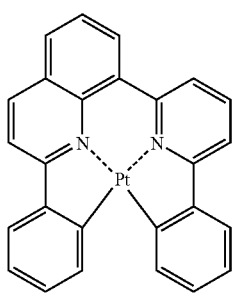
(58) 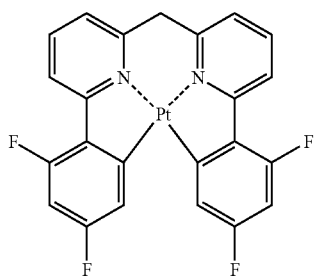
(59) 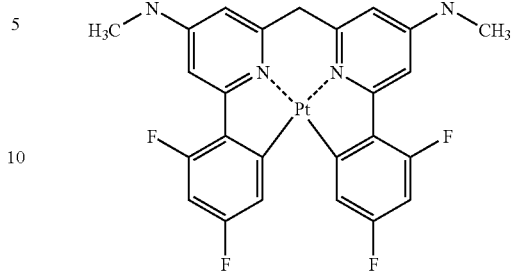
(60) 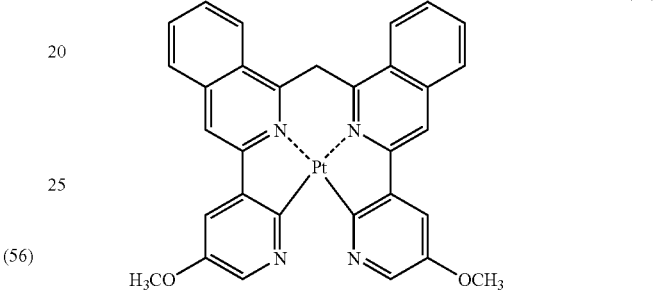
(61) 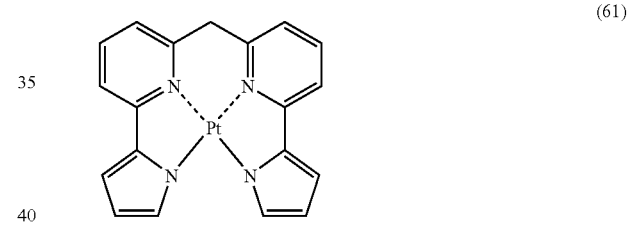
(62) 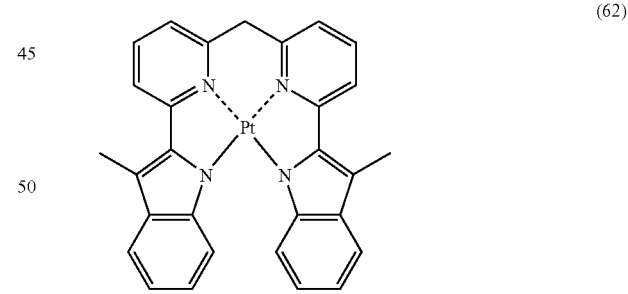
(63) 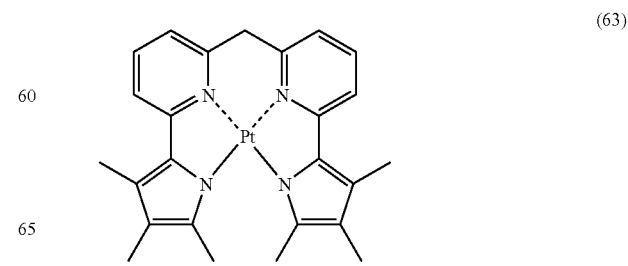

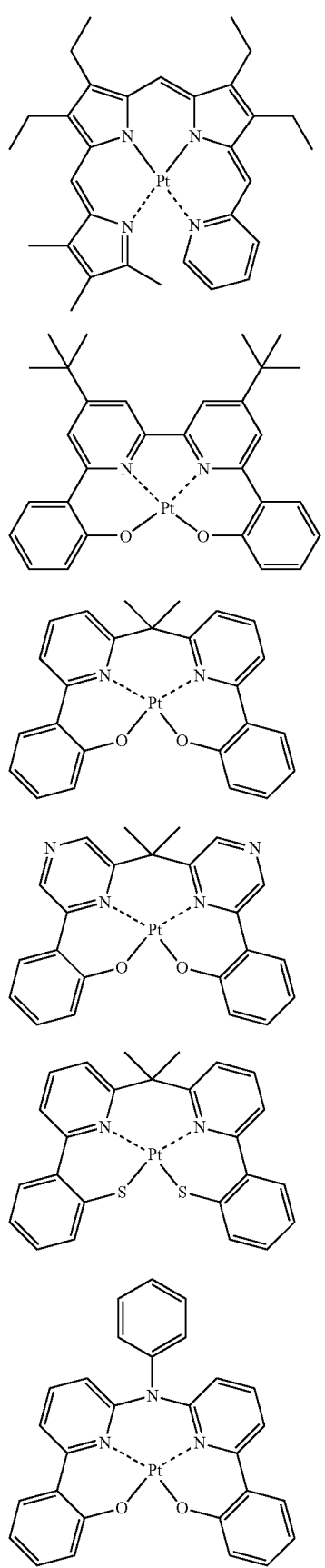
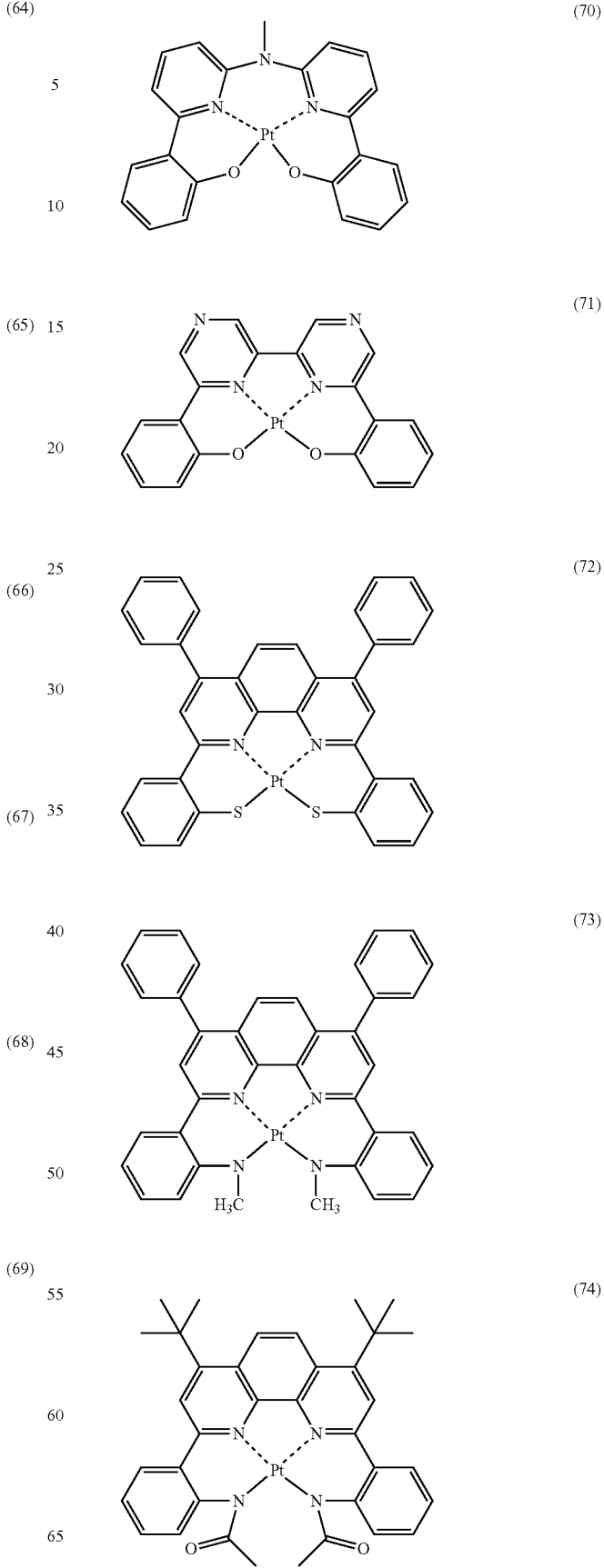

(75) 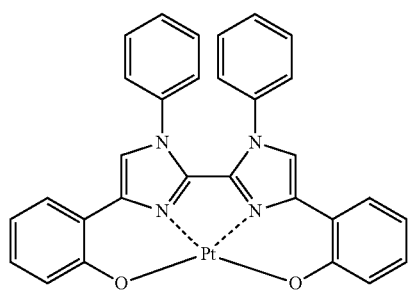
(76) 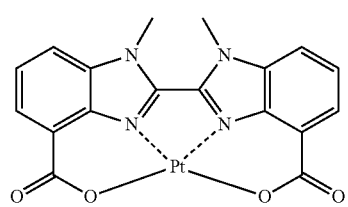
(77) 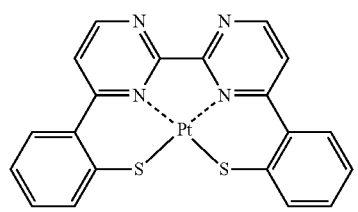
(78) 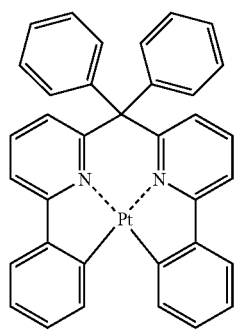
(79) 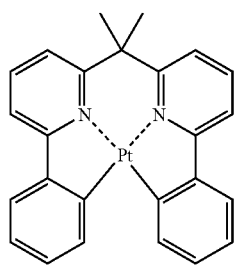
(80) 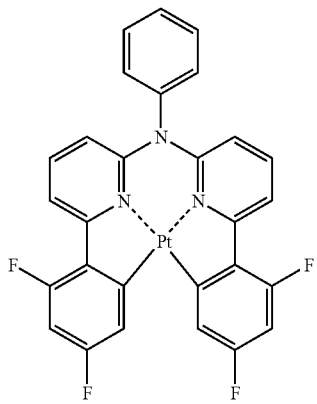
(81) 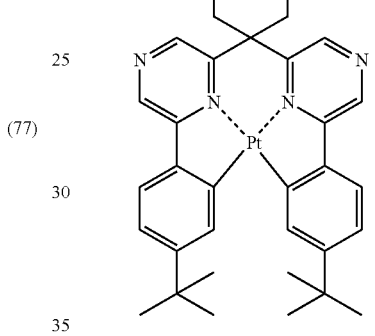
(82) 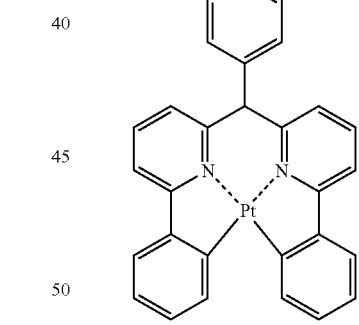
(83) 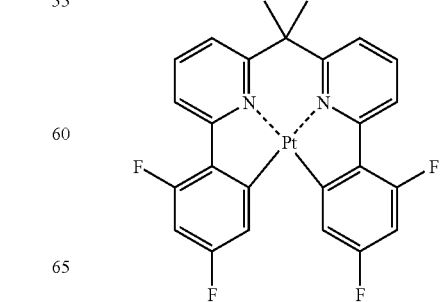

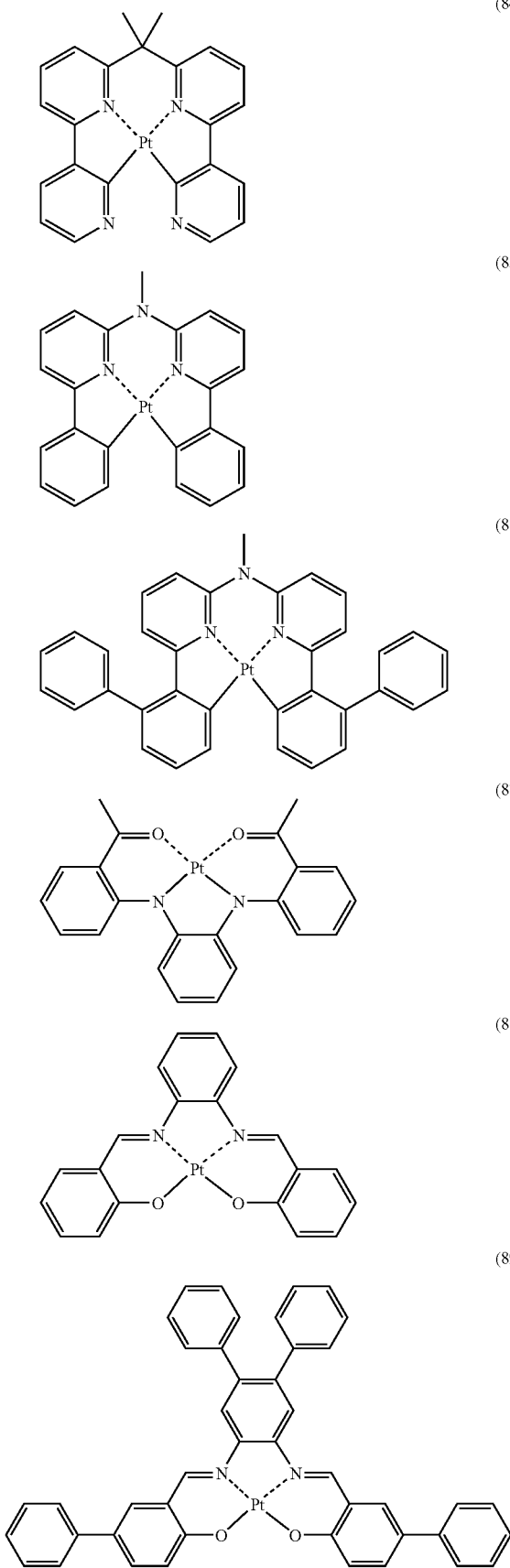
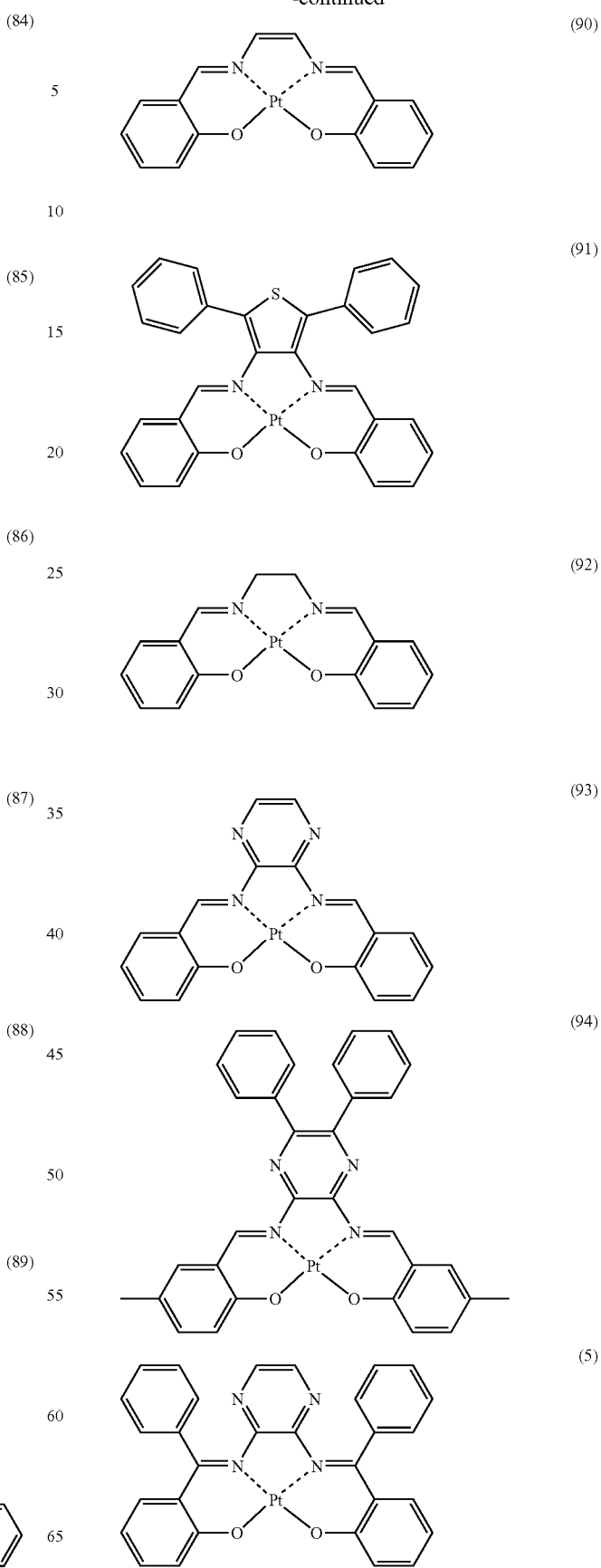

-continued
(96) 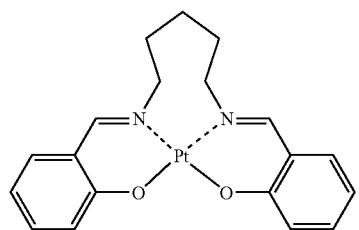
(97) 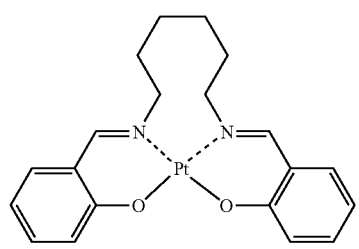
(98) 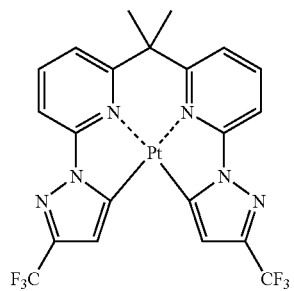
(99) 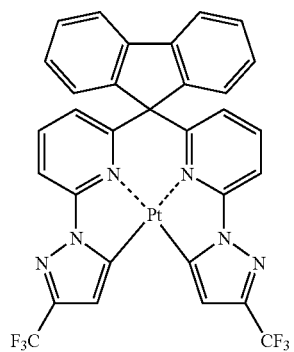
(100) 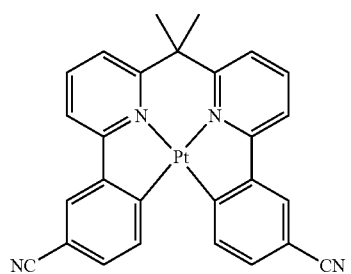
-continued
(101) 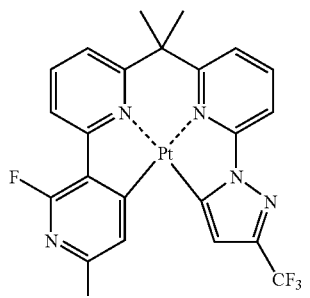
D-1 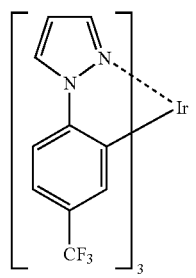
D-2 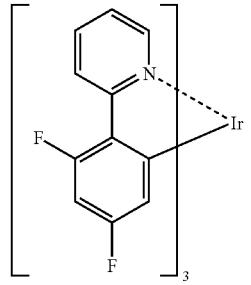
D-3 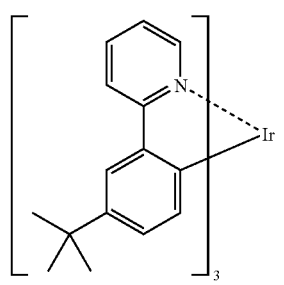
D-4 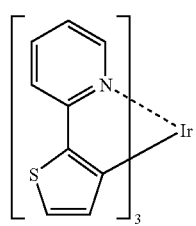

-continued
D-5
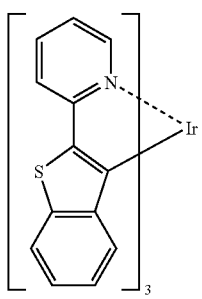
D-6
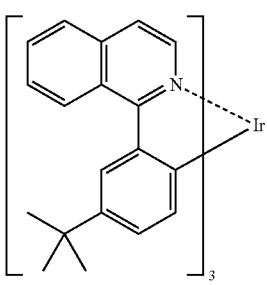
D-7
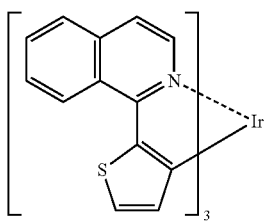
D-8
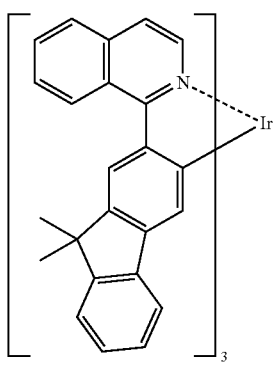
D-9
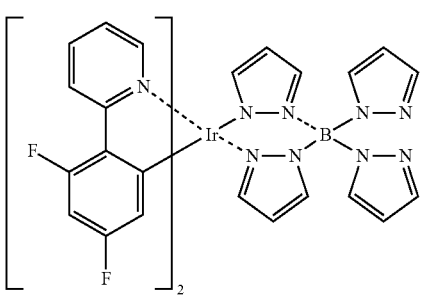
-continued
D-10
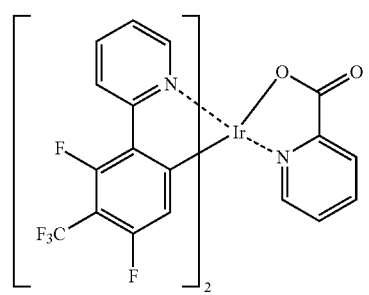
D-11
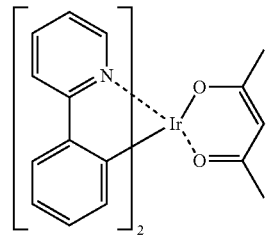
D-12
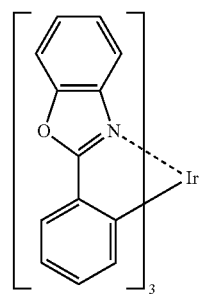
D-13
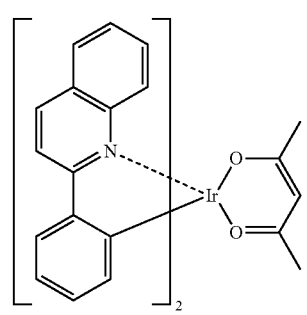
D-14
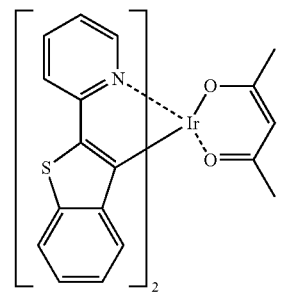

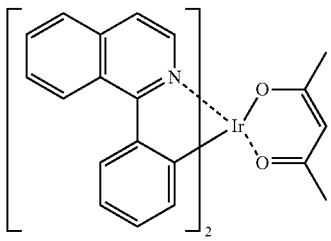

D-15

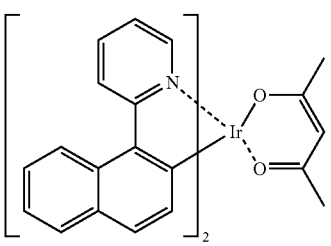

D-16

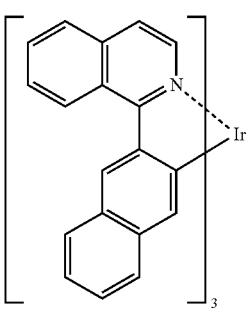

D-18

The phosphorescent materials that emit light of blue, green and red used in the invention may be selected from those as described above.

<Host Material>

The luminescent layer in the invention preferably includes a host material, together with the luminescent material as a guest. The host material used in the invention may be either an electron-transporting host material or a hole-transporting host material. When an electron-transporting luminescent material is used as a guest, a hole-transporting host material is preferably used. When a hole-transporting luminescent material is used as a guest, an electron-transporting host material is preferably used.

<Hole-Transporting Host Material>

The hole-transporting host material used in the luminescent layer of the invention preferably has an ionization potential (Ip) of from 5.1 eV to 6.4 eV, more preferably from 5.4 eV to 6.2 eV, and further preferably from 5.6 eV to 6.0 eV, in view of improving the durability and reducing the driving voltage. Further, the hole-transporting host material preferably has an electron affinity (Ea) of from 1.2 eV to 3.1 eV, more preferably from 1.4 eV to 3.0 eV, and further preferably from 1.8 eV to 2.8 eV, in view of improving the durability and reducing the driving voltage.

Examples of the hole-transporting host material having the above characteristics include pyrrole, carbazole, indole, pyrazole, imidazole, polyarylalkane, pyrazoline, pyrazolone, phenylenediamine, arylamine, amino-substituted chalcone, styrylanthracene, fluolenone, hydrazone, stilbene, silazane, aromatic tertiary amine compounds, styrylamine compounds, aromatic dimethylidene compounds, porphyrin compounds, polysilane compounds, poly(N-vinylcarbazole), aniline copolymers, conductive polymeric oligomers such as thiophene oligomers or polythiophene, organic silane, carbon, and derivatives of these compounds.

Among these, carbazole derivatives, indole derivatives, aromatic tertiary amine compounds, and thiophene derivatives are preferred, and those having two or more of at least one of a carbazole skeleton, an indole skeleton, and an aromatic tertiary amine skeleton are particularly preferred.

The following are specific examples of the hole-transporting material having the above characteristics, but the invention is not limited thereto.

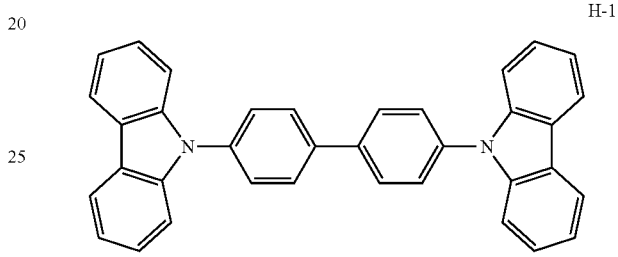

H-1

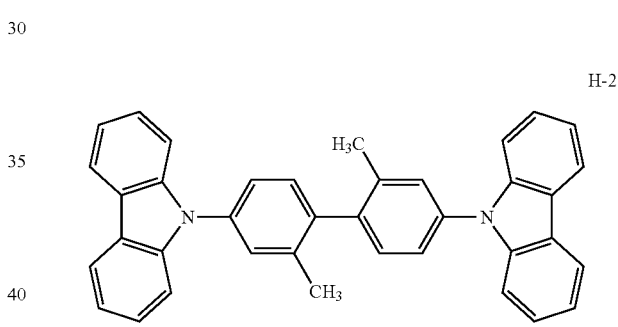

H-2

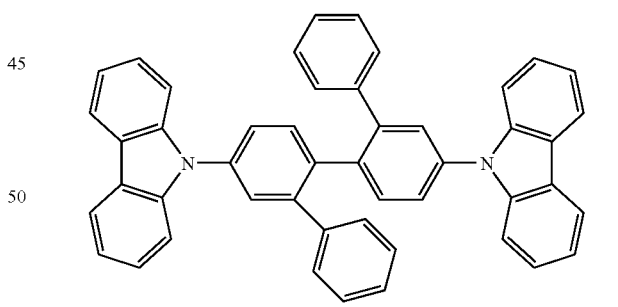

H-3

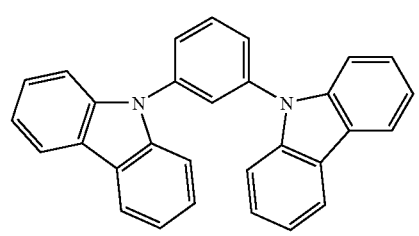

H-4

-continued
H-5
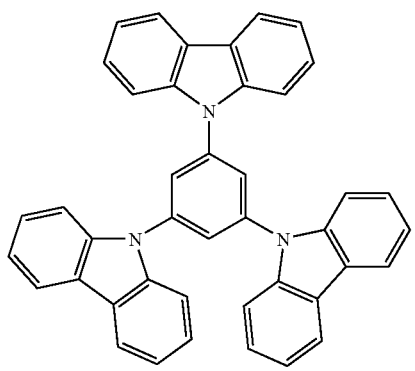
H-6
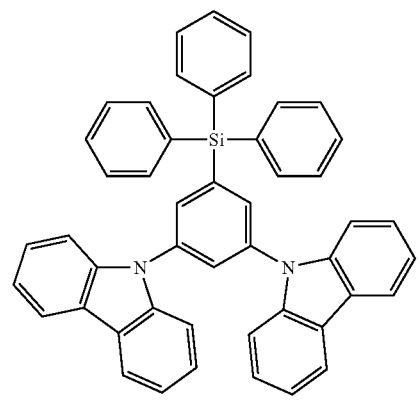
H-7
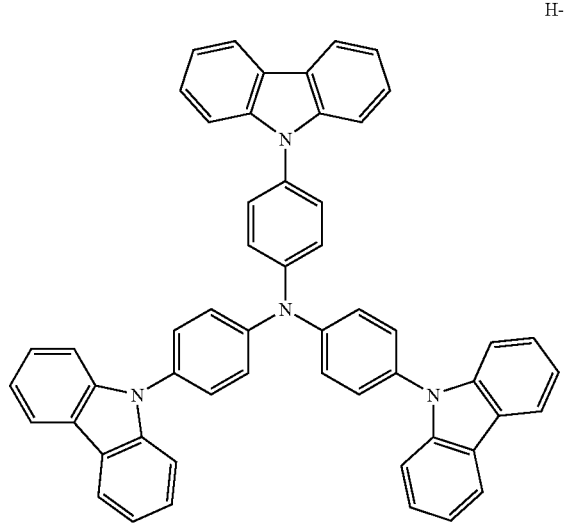
-continued
H-8
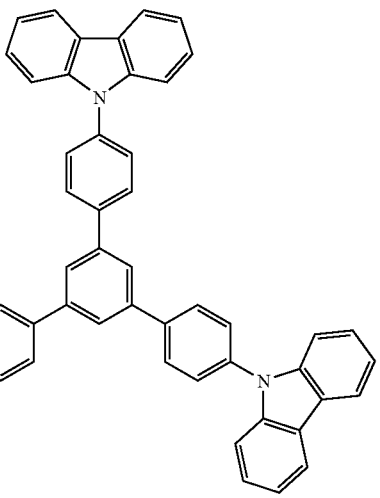
H-9
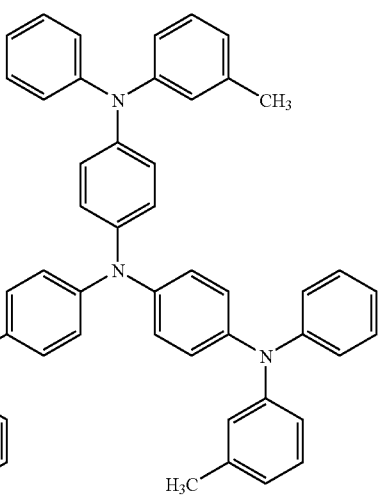
H-10
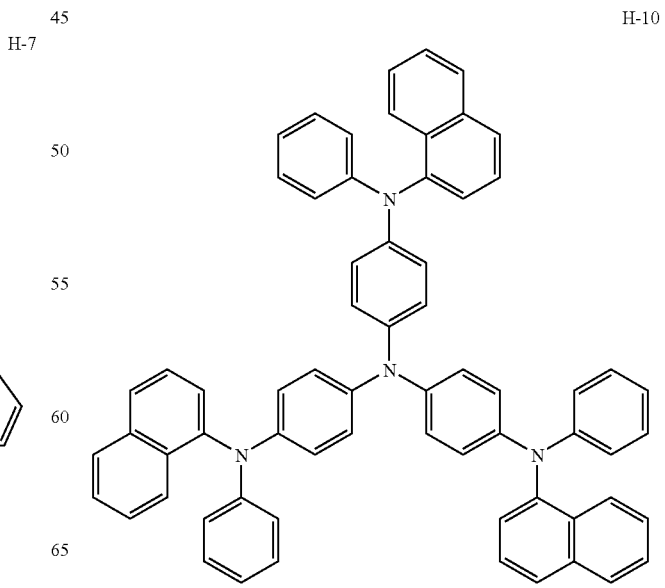

H-11
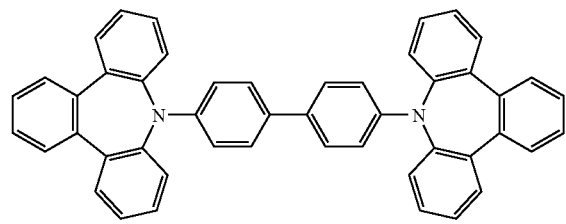
H-12
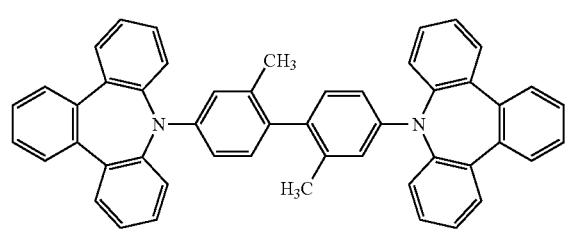
H-13
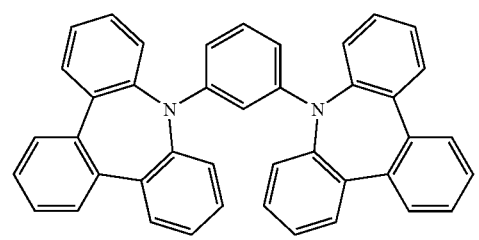
H-14
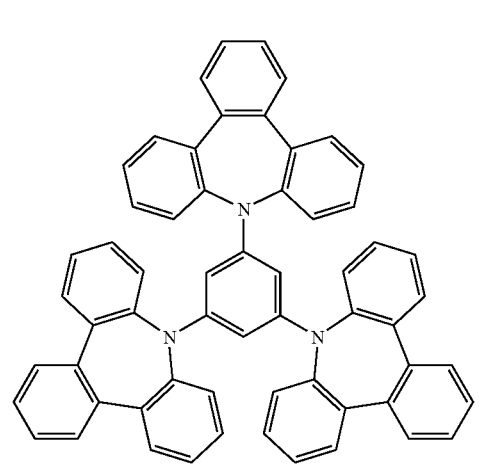
H-15
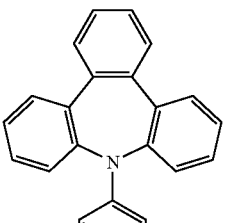
H-16
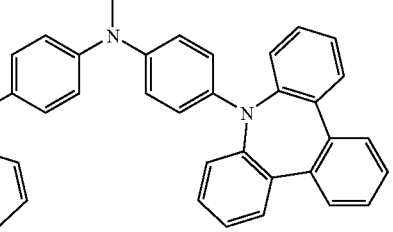
H-17
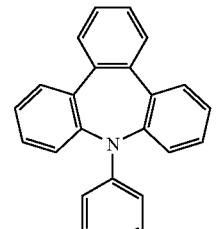
H-18

H-19
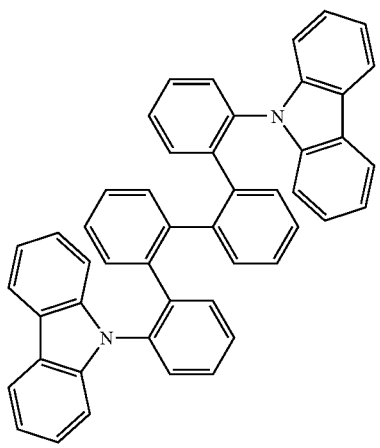
H-20
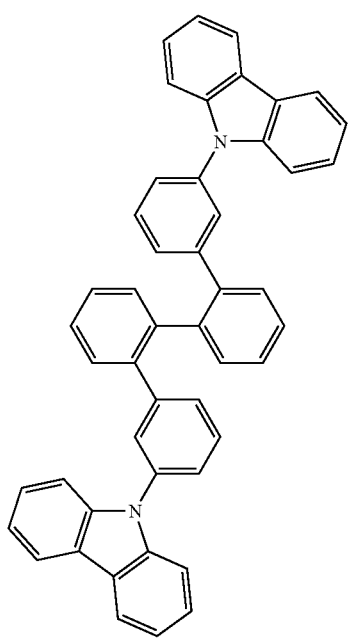
H-21
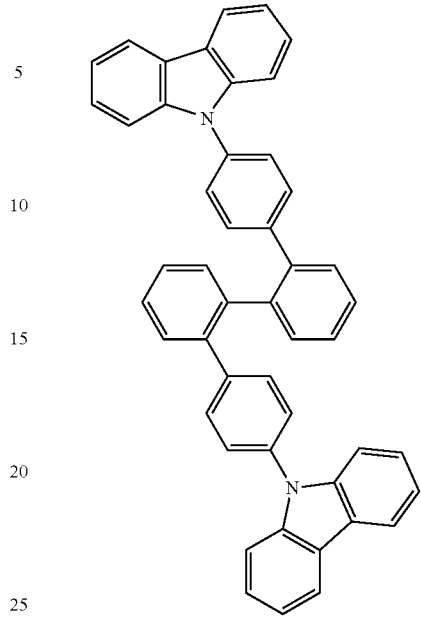
H-22
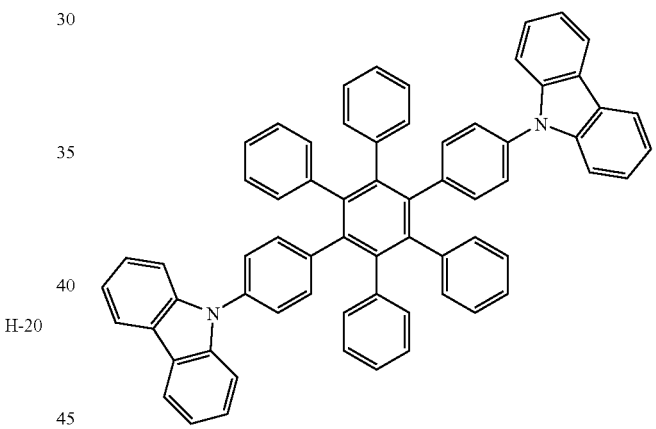
H-23
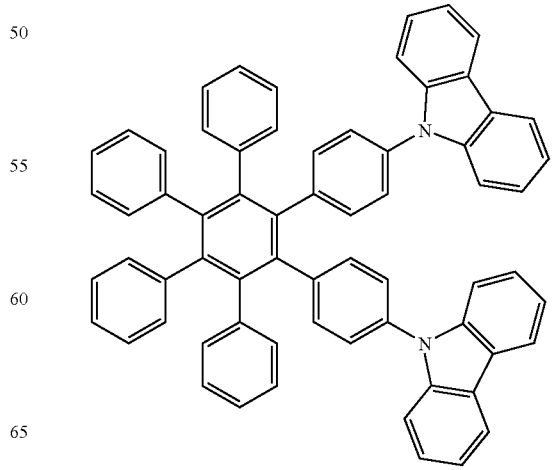

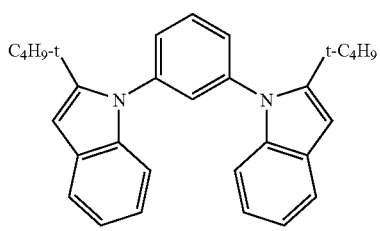
H-24

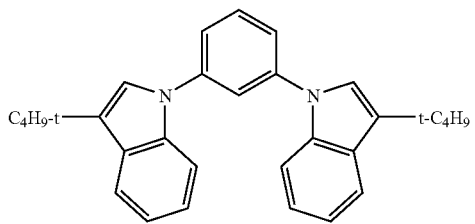
H-25

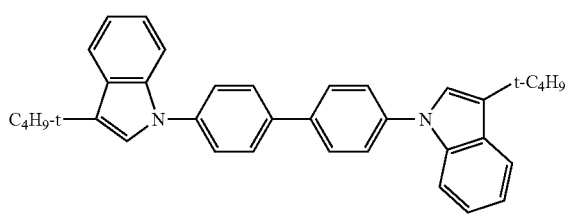
H-26

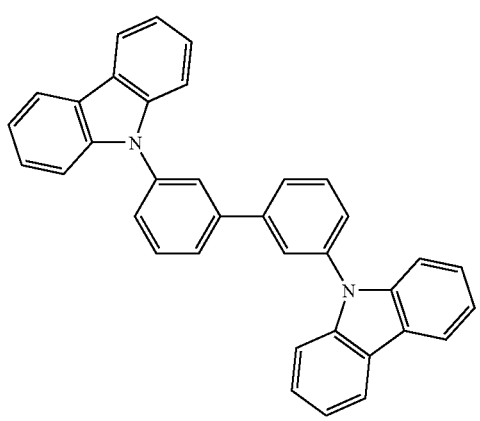
H-27

<Electron-Transporting Host Material>

The electron-transporting host material used in the luminescent layer of the invention preferably has an electron affinity (Ea) of from 2.5 eV to 3.5 eV, more preferably from 2.6 eV to 3.4 eV, and further preferably from 2.8 eV to 3.3 eV, in view of improving the durability and reducing the driving voltage. Further, the electron-transporting host material preferably has an ionization potential (Ip) of from 5.7 eV to 7.5 eV, more preferably from 5.8 eV to 7.0 eV, and further preferably from 5.9 eV to 6.5 eV, in view of improving the durability and reducing the driving voltage.

Specific examples of the electron-transporting host material having the above characteristics include pyridine, pyrimidine, triazine, imidazole, pyrazol, triazole, oxazole, oxadiazole, fluorenone, anthraquinodimethane, anthrone, diphenylquinone, thiopyrandioxide, carbodiimide, fluorenilidenemethane, distyrylpyrazine, fluorine-substituted aromatic compounds, aromatic tetracarboxylic anhydrides such as perylene and naphthalene, phthalocyanine, derivatives of these compounds which may form a condensed ring with other ring(s), and metal complexes including those of 8-quinolinol derivatives, metal phthalocyanines, and those having benzoxazole, benzthiazole or the like as a ligand.

Preferred electron-transporting host materials include a metal complex, an azole derivative (such as a benzimidazole derivative or an imidazopyridine derivative), and an azine derivative (such as a pyridine derivative, a pyrimidine derivative or a triazine derivative). Among these, a metal complex compound is particularly preferred in view of durability. The metal complex compound preferably has a ligand including at least one nitrogen atom, oxygen atom or a sulfur atom that forms a coordination bond with the meal.

Exemplary metal ions in the metal complex include, but not particularly limited thereto a berylium ion, a magnesium ion, an aluminum ion, a gallium ion, a zinc ion, an indium ion, a tin ion, a platinum ion, and a palladium ion. Among these, a berylium ion, an aluminum ion, a gallium ion, a zinc ion, a platinum ion and a palladium ion are preferred, and an aluminum ion, a zinc ion and a palladium ion are more preferred.

Exemplary ligands included in the aforementioned metal complexes are described in H. Yersin et al., Photochemistry and Photophysics of Coordination Compounds, published by Springer-Verlag (1987); and Akio Yamamoto, Organometallic Chemistry—Basics and Applications—, published by Shokabo Publishing Co., Ltd. (1982).

Among the above ligands, a nitrogen-containing heterocycle ligand (preferably having 1 to 30 carbon atoms, more preferably having 2 to 20 carbon atoms, particularly preferably having 3 to 15 carbon atoms) is preferred. The ligand may be monodentate or two or higher-dentate, preferably from bidentate to hexadentate. It is also suitable to use a bidentate to hexadentate ligand and a monodentate ligand in combination.

Exemplary ligands include azine ligands (such as a pyridine ligand, a bipyridyl ligand, and a terpyridine ligand); hydroxyphenylazole ligands (such as a hydroxyphenylbenzimidazole ligand, a hydroxyphenylbenzoxasole ligand, a hydroxyphenylimidazole ligand, and a hydroxyphenylimidazopyridine ligand); alkoxy ligands (preferably having 1 to 30 carbon atoms, more preferably 1 to 20 carbon atoms, particularly preferably 1 to 10 carbon atoms, such as a methoxy ligand, an ethoxy ligand, a butoxy ligand, and a 2-ethylhexyloxy ligand); aryloxy ligands (preferably having 6 to 30 carbon atoms, more preferably 6 to 20 carbon atoms, particularly preferably 6 to 12 carbon atoms, such as a phenyloxy ligand, a 1-naphthyloxy ligand, a 2-naphthyloxy ligand, a 2,4,6-trimethylphenyloxy ligand, and a 4-biphenyloxy ligand).

heteroaryloxy ligands (preferably having 1 to 30 carbon atoms, more preferably 1 to 20 carbon atoms, particularly preferably 1 to 12 carbon atoms, such as a pyridyloxy ligand, a pyrazyloxy ligand, a pyrimidyloxy ligand, and a quinolyloxy ligand); alkylthio ligands (preferably having 1 to 30 carbon atoms, more preferably 1 to 20 carbon atoms, particularly preferably 1 to 12 carbon atoms, such as a methylthio ligand and an ethylthio ligand); arylthio ligands (preferably having 6 to 30 carbon atoms, more preferably 6 to 20 carbon atoms, particularly preferably 6 to 12 carbon atoms, such as a phenylthio ligand); heteroarylthio ligands (preferably having 1 to 30 carbon atoms, more preferably 1 to 20 carbon atoms, particularly preferably 1 to 12 carbon atoms, such as a pyridylthio ligand, a 2-benzimidazolylthio ligand, a 2-benzoxazolylthio ligand, and a 2-benzthioazolylthio ligand); siloxy ligands (preferably having 1 to 30 carbon atoms, more preferably 3 to 25 carbon atoms, particularly preferably 6 to 20 carbon atoms, such as a triphenylsiloxy group, a triethoxysiloxy group, and a triisopropylsiloxy group); aromatic hydrocarbon anion ligands (preferably having 6 to 30 carbon atoms, more preferably 6 to 25 carbon atoms, particularly preferably 6 to 20 carbon atoms, such as a phenyl anion, a naphthyl anion, and an anthranyl anion); aromatic heterocycle anion ligands (preferably having 1 to 30 carbon atoms, more preferably 2 to 25 carbon atoms, particularly preferably 2 to 20 carbon atoms, such as a pyrrole anion, a pyrazole anion, a triazole anion, an oxazole anion, a benzoxazole anion, a thiazole anion, a benzothiazole anion, a thiophene anion, and a benzothiophene anion); and indolenine ligands. Among these, nitrogen-containing heterocycle ligands, aryloxy ligands, heteroaryloxy ligands, siloxy ligands, aromatic hydrocarbon anion ligands and aromatic heterocycle anion ligands are preferred; and nitrogen-containing heterocycle ligands, aryloxy ligands, siloxy ligands, aromatic hydrocarbon anion ligands, and aromatic heterocycle anion ligands are particularly preferred.

Exemplary metal complexes that can be used as an electron-transporting host material are described in JP-A No. 2002-235076, JP-A No. 2004-214179, JP-A No. 2004-221062, JP-A No. 2004-221065, JP-A No. 2004-221068, and JP-A No. 2004-327313.

Specific examples of the electron-transporting host material as mentioned above include the following compounds, but the invention is not limited thereto.

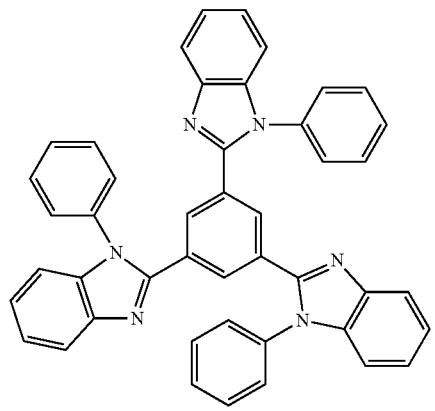

E-1

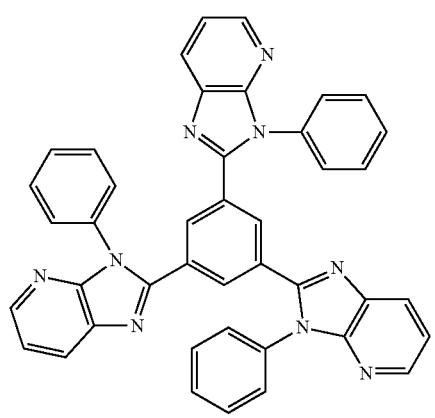

E-2

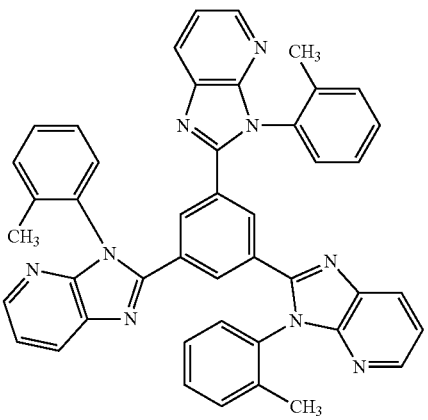

E-3

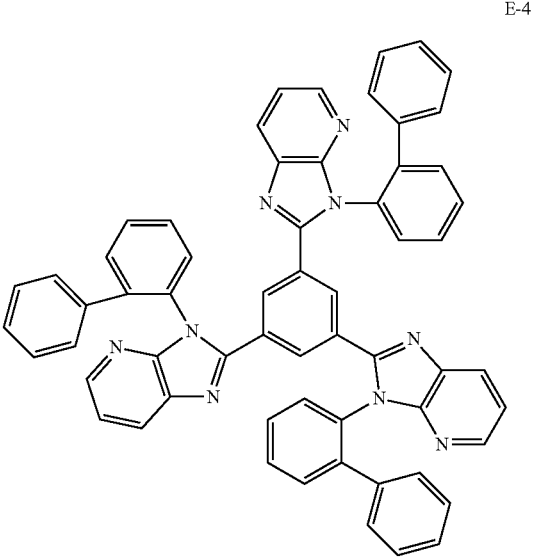

E-4

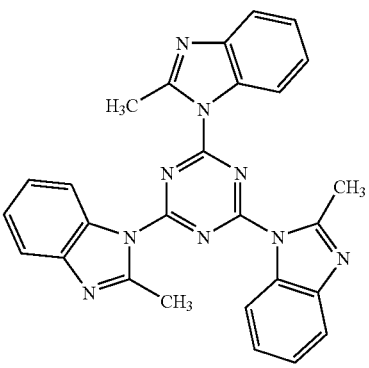

E-5

E-6
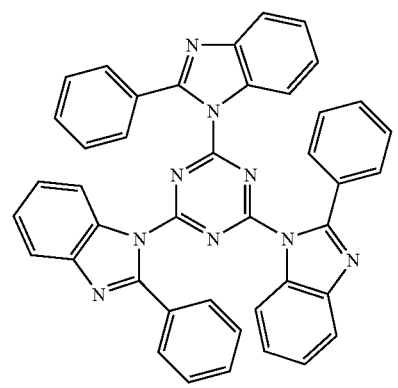
E-7
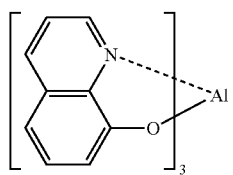
E-8
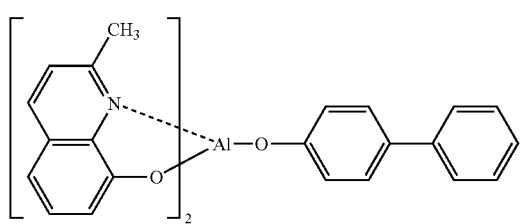
E-9
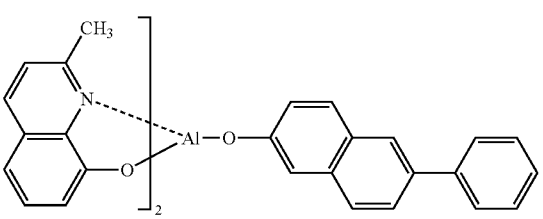
E-10
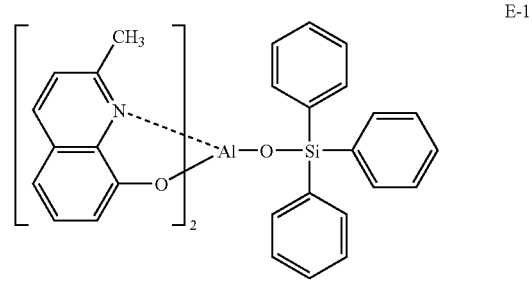
E-11
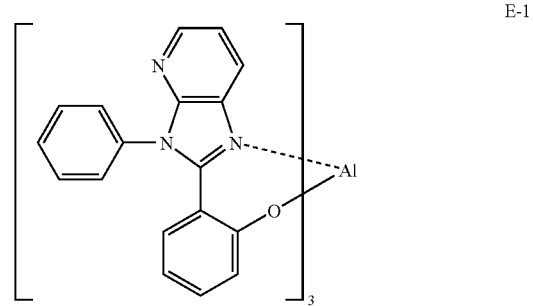
E-12
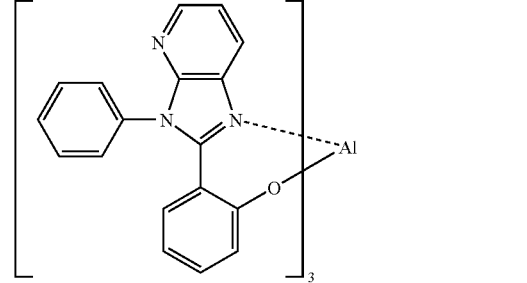
E-13
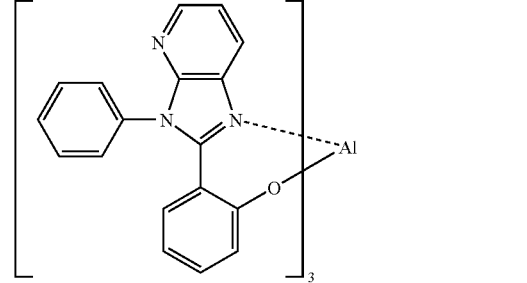
E-14
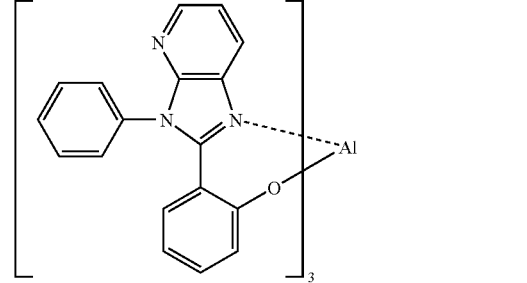
E-15
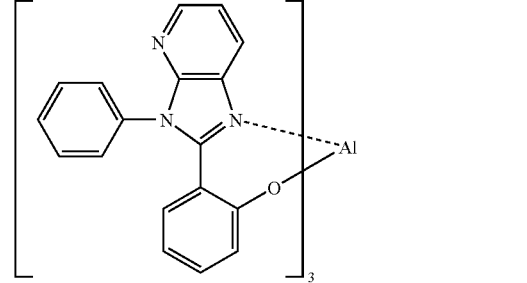
E-16
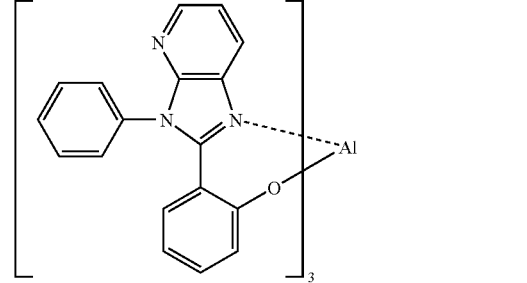
E-17
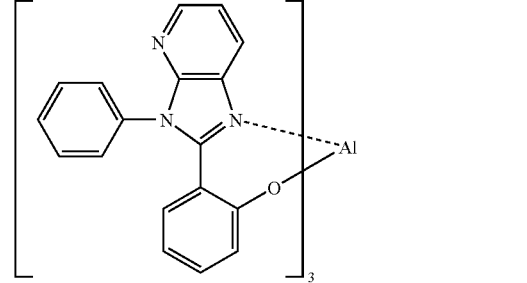

E-18 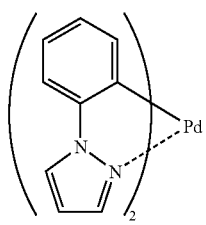

E-19 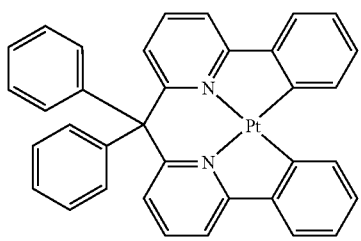

E-20 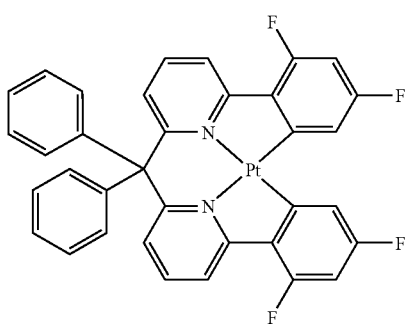

E-21 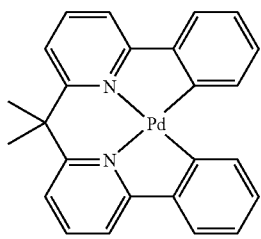

E-22 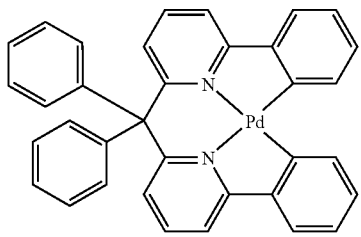

E-23 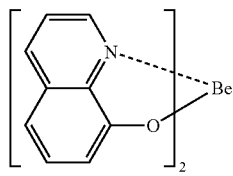

E-24 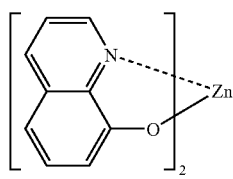

E-25 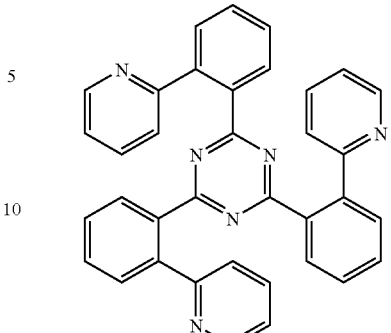

E-26 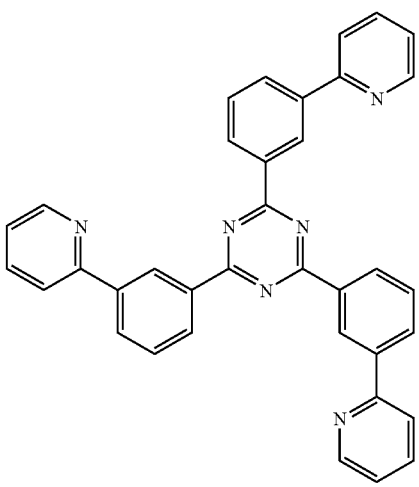

(Hole-Injection Layer and Hole-Transporting Layer)

A hole-injection layer and a hole-transporting layer have a function of receiving holes from the anode or the anode side, and transporting the same to the cathode side. These layers preferably include carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidene compounds, porphyrin compounds, organic silane derivatives, carbon, or the like.

The hole-injection layer and the hole-transporting layer preferably have a thickness of from 50 nm or less, respectively, from the viewpoint of reducing the driving voltage.

The thickness of the hole-transporting layer is preferably from 5 nm to 50 m, more preferably from 10 nm to 40 nm.

The thickness of the hole-injection layer is preferably from 0.5 nm to 50 nm, more preferably from 1 nm to 40 nm.

The hole-injection layer and the hole-transporting layer may have a monolayer structure formed of one or more kinds of the aforementioned material, or may have a multilayer structure formed of plural layers having the same or different compositions.

(Electron-Injection Layer and Electron-Transporting Layer)

An electron-injection layer and an electron-transporting layer have a function of receiving electrons from the cathode or the cathode side, and transporting the same to the anode side. These layers preferably include triazole derivatives, oxazole derivatives, oxadiazole derivatives, imidazole derivatives, fluorenone derivatives, anthraquinodimethane derivatives, anthorone derivatives, diphenylquinone derivative, thiopyrandioxide derivatives, carbodiimide derivatives, fluorenylidene methane derivatives, distyrylpyrazine derivatives, aromatic tetracarboxylic acid anhydrides such as naphthalene and perylene, phthalocyanine derivatives, and metal complexes including those of 8-quinolinol derivatives, metal phthalocyanines, and metal complexes having benzoxazole or benzothiazole as a ligand, organic silane derivatives, or the like.

The electron-injection layer and the electron-transporting layer preferably have a thickness of 50 nm or less, respectively, from the viewpoint of reducing the driving voltage.

The thickness of the electron-transporting layer is preferably from 5 nm to 50 nm, more preferably from 10 nm to 50 nm.

The thickness of the electron-injection layer is preferably from 0.1 nm to 50 nm, more preferably from 0.5 nm to 20 nm.

The electron-injection layer and the electron-transporting layer may have a monolayer structure formed of one or more kinds of the aforementioned material, or may have a multilayer structure formed of plural layers having the same or different compositions.

When the electron-transporting layer is positioned adjacent to the luminescent portion, the layer is preferably formed from a material having an ionization potential of 6.0 eV or less from the viewpoint of improving the durability.

—Substrate—

The support used in the invention is preferably formed from a material that does not scatter or attenuate the light emitted from the organic compound layer. Specific examples thereof include inorganic materials such as YSZ (yttria-stabilized zirconia) or glass, organic materials such as polyesters (e.g., polyethylene terephthalate, polybutylene tetephthalate and polyethylene naphthalate), polystyrene, polycarbonate, polyether sulfone, polyarylate, polyimide, polycycloolefin, norbornene resin, and poly(chlorotrifluoroethylene).

When using glass for the substrate, non-alkali glass is preferably used in order to reduce the elusion of ions from the glass. When using soda-lime glass is used, those having a barrier coating of silica or the like is preferably selected.

When using an organic material, those having excellent heat-resistance, dimension-stability, solvent-resistance, insulating property and processability are preferably selected.

The shape, structure, size or the like of the substrate is not particularly limited, and may be selected as appropriate according to the applications of the organic EL device. The substrate typically has a plate-like shape. The substrate may have a monolayer structure or a multilayer structure. Further, the substrate may be formed of a single member or formed of two or more members.

The substrate may be colored or colorless, but preferably colorless and transparent so as not to scatter or attenuate the light emitted from the organic compound layer.

The substrate may have a moisture-proof layer (gas barrier layer) on the front surface or the back surface thereof.

Suitable materials for the moisture proof layer (gas barrier layer) include inorganic materials such as silicon nitride or silicon oxide. The moisture proof layer (gas barrier layer) may be formed by high-frequency sputtering or the like.

When a thermoplastic material is used for the substrate, a hard coat layer, an undercoat layer or the like may be formed thereon, as necessary.

(Electrodes)

<Anode>

The shape, structure or size of the anode is not particularly limited as long as it has a function of supplying holes to the organic compound layer, and may be appropriately selected based on the applications of the organic EL device. As mentioned above, the anode is typically formed as a transparent anode.

Exemplary materials for the anode include metals, alloys, metal oxides, conductive compounds, or mixtures thereof, and materials having a work function of 4.0 eV or more are preferred. Specific examples thereof include conductive metal oxides, such as tin oxide doped with antimony, fluorine or the like (ATO, FTO or the like), tin oxide, zinc oxide, indium oxide, indium tin oxide (ITO), indium zinc oxide (IZO), metals such as gold, silver, chromium, nickel or the like, a mixture or a layered material of the above metal and a conductive metal oxide, inorganic conductive materials such as copper iodide, copper sulfide or the like, organic conductive materials such as polyaniline, polythiophene, polypyrrole or the like, or a layered material of the above organic conductive material and ITO. Among these, ITO is preferred in view of productivity, conductivity or transparency.

The method of forming the anode may be appropriately selected in view of suitability to the raw material for the anode, and examples thereof include a wet method such as printing or coating, a physical method such as vacuum evaporation, sputtering or ion plating, or a chemical method such as CVD or plasma CVD. For example, when ITO is selected as the raw material, the anode may be formed by direct-current or high-frequency sputtering, vacuum evaporation, ion plating or the like.

The position of the anode may be selected as appropriate according to the applications or usage of the organic EL device. For example, the anode may be formed on the entire surface of the substrate, or on a portion of the substrate.

The patterning of the anode may be conducted by chemical etching such as photolithography, or by physical etching using laser beams. Further, the patterning may be conducted by performing vacuum evaporation or sputtering using a mask, a lift-off method, or a printing method.

The thickness of the anode may be selected as appropriate according to the type of the raw material or the like, but is typically from 10 nm to 50 μm, preferably from 50 nm to 20 μm.

The resistivity of the anode is preferably $10^3$ Ω/square or less, more preferably $10^2$ Ω/square or less. When the anode is transparent, it may be colored or colorless but when light is taken out from the anode side, the anode preferably has a transmittance of 60% or more, more preferably 70% or more.

Details of the transparent anode are described in "New Development of Transparent Electrode Film", edited by Yutaka Sawada, published by CMC Publishing Co., Ltd. (1999), and the contents thereof may be applied to the present invention. When a plastic substrate having a low heat resistance is used, the anode is preferably formed using ITO or IZO at a temperature of 150° C. or less.

—Cathode—

Typically, the shape, structure or size of the cathode is not particularly limited as long as the cathode has a function of injecting electrons to the organic compound layer, and may be selected from known electrode materials as appropriate according to the applications or usage of the organic EL device.

Exemplary materials for the cathode include metals, alloys, metal oxides, conductive compounds or a mixture thereof, and materials having a work function of 4.5 eV or less are preferred. Specific examples thereof include alkali metals (such as Li, Na, K and Cs), alkaline earth metals (such as Mg and Ca), gold, silver, lead, aluminum, sodium-potassium alloy, lithium-aluminum alloy, magnesium-silver alloy, indium, and rare earth metals such as ytterbium. These raw materials may be used alone, but preferably in combination of two or more kinds in view of achieving both stability and electron-injection suitability at the same time.

Among the above, an alkali metal or an alkaline earth metal is preferred in view of electron-injection suitability, while a material including aluminum as a main component is preferred in view of storage stability.

The material including aluminum as a main component refers to pure aluminum, or an alloy or a mixture of aluminum with 0.01 to 10% by mass of an alkali metal or an alkaline earth metal (such as lithium-aluminum alloy or magnesium-aluminum alloy).

Details of the material for the cathode are described in JP-A No. 2-15595 and JP-A No. 5-121172, and the contents thereof may be applied to the present invention.

The method of forming the cathode is not particularly limited, and may be formed by a known method. For example, the cathode may be formed by a method selected as appropriate according to the suitability for its material, including a wet method such as printing or coating, a physical method such as vacuum evaporation, sputtering or ion plating, or a chemical method such as CVD or plasma CVD. For example, when the cathode is formed from a metal or the like, the cathode can be formed from one or more kinds of metal by performing sputtering, simultaneously or in separate processes.

The patterning of the cathode may be conducted by chemical etching such as photolithography, or by physical etching using laser beams. Alternatively, the cathode may be formed by vacuum evaporation or sputtering using a mask, a lift-off method, or a printing method.

The position of the cathode is not particularly limited, and may be formed on the entire surface of the organic compound layer, or may be formed on a portion of the organic compound layer.

A dielectric layer having a thickness of from 0.1 nm to 5 nm, formed from a fluoride, an oxide or the like of an alkali metal or an alkaline earth metal as mentioned above, may be provided between the cathode and the organic compound layer. The dielectric layer may be regarded as a kind of electron-injection layer. The dielectric layer may be formed by vacuum evaporation, sputtering, ion plating, or the like.

The thickness of the cathode may be selected as appropriate according to the type of raw material for the cathode or the direction of taking out the light, but is typically about 10 nm to 5 μm, preferably about 50 nm to 1 μm. The cathode may be transparent or may not be transparent. When a transparent cathode is desired, the cathode can be obtained by forming a thin film having a thickness of about 1 nm to 10 nm from the material for the cathode, and then forming a layer of transparent conductive material such as ITO or IZO on the thin film.

—Protection Layer—

In the invention, the organic EL device may be protected by a protection layer. The material for the protection layer is not particularly limited as long as it has a function of preventing the entering of a substance that promotes deterioration of the device, such as moisture or oxygen, into the device.

Specific examples of the material include metals such as In, Sn, Pb, Au, Cu, Al, Ti or Ni, metal oxides such as MgO, SiO, $SiO_2$, $Al_2O_3$, GeO, NiO, CaO, BaO, $Fe_2O_3$, $Y_2O_3$ or $TiO_2$, metal nitrides such as $SiN_x$ or $SiN_xO_y$, metal fluorides such as $MgF_2$, LiF, $AlF_3$ or $CaF_2$, polyethylene, polypropylene, polymethyl methacrylate, polyimide, polyurea, polytetrafluoroethylene, polychlorotrifluoroethylene, polydichlorodifluoroethylene, copolymers of chlorotrifluoroethylene and dichlorodifluoroethylene, copolymers obtained by copolymerizing a monomer mixture including tetrafluoroethylene and at least one kind of comonomer, fluorine-containing copolymers having a cyclic structure in a copolymer main chain, water-absorbing materials having a water absorption of 1% or more, and moisture-proof materials having a water absorption of 0.1% or less.

The method of forming the protection layer is not particularly limited, and may be conducted by a vacuum evaporation method, a sputtering method, a reactive sputtering method, an MBE (Molecular Beam Epitaxy) method, a cluster ion beam method, an ion plating method, a plasma polymerization method (high-frequency excited ion plating method), a plasma CVD method, a laser CVD method, a thermal CVD method, a gas source CVD method, a coating method, a printing method, a transfer method, or the like.

—Sealing—

The organic EL device may be sealed using a sealing member, such as a sealing container. Further, a water absorbing material or an inert liquid may be included in a space between the sealing container and the organic EL device.

The water absorbing material is not particularly limited, and examples thereof include barium oxide, sodium oxide, potassium oxide, calcium oxide, sodium sulfate, calcium sulfate, magnesium sulfate, phosphorus pentoxide, calcium chloride, magnesium chloride, copper chloride, cesium fluoride, niobium fluoride, calcium bromide, vanadium bromide, molecular sieve, zeolite, and magnesium oxide. The inert liquid is not particularly limited, and examples thereof include paraffins, fluid paraffins, fluorine-based solvents such as perfluoroalkane, perfluoroamine and perfluoroether, chlorine-based solvents, and silicone oils.

(Driving Method)

The organic EL device of the invention emits light by applying a direct (an alternate component may be included, as necessary) voltage (typically from 2 to 15 V), or by applying a direct current.

The driving method described in JP-A Nos. 2-148687, 6-301355, 5-29080, 7-134558, 8-234685 and 8-241047, Japanese Patent No. 2784615, U.S. Pat. Nos. 5,828,429 and 6,023,308, and the like, may be applied to the organic EL device of the invention.

—Applications—

The applications of the organic EL device of the invention is not particularly limited, and the organic EL device may be suitably used for a cellular phone display, a personal digital assistant (PDA), a computer display, an information display of a car, a TV monitor, illuminating devices, or the like.

The following are exemplary embodiments of the invention. However, the invention is not limited thereto.

<1> An organic EL device comprising an anode, a cathode, and a luminescent portion positioned between the anode and cathode, the luminescent portion comprising two or more luminescent layers, each of the luminescent layers comprising plural primary luminescent layers that emit light of different colors, and each of the primary luminescent layers having a thickness of 5 nm or less.

<2> The organic EL device according to <1>, wherein in each of the luminescent layers, the primary luminescent layers that emit light of different colors are adjacent to each other.

<3> The organic EL device according to <1>, wherein the luminescent portion emits white light by mixing the colors of light emitted from the primary luminescent layers.

<4> The organic EL device according to <1>, wherein in each of the luminescent layers, the primary luminescent layer comprising a luminescent material that emits light of the shortest wavelength is at least twice as thick as the primary luminescent layer comprising a luminescent material that emits light of the longest wavelength.

<5> The organic EL device according to <1>, wherein the primary luminescent layers each independently comprise a luminescent material and a host material, and in each of the luminescent layers, the concentration of the luminescent material that emits light of the shortest wavelength in the primary luminescent layer is at least twice as high as the concentration of the luminescent material that emits light of the longest wavelength in the primary luminescent layer.

<6> The organic EL device according to <1>, wherein in each of the luminescent layers, the primary luminescent layer comprising a luminescent material that emits light of the shortest wavelength is at least twice as thick as the primary luminescent layer comprising a luminescent material that emits light of the longest wavelength; and wherein in each of the luminescent layers, the concentration of the luminescent material that emits light of the shortest wavelength in the primary luminescent layer is at least twice as high as the concentration of the luminescent material that emits light of the longest wavelength in the primary luminescent layer.

<7> The organic EL device according to <1>, wherein the luminescent portion comprises four or more luminescent layers each comprising plural primary luminescent layers that emit light of different colors.

<8> The organic EL device according to <1>, wherein the primary luminescent layers in each of the luminescent layers comprise a red primary luminescent layer, a green primary luminescent layer, and a blue primary luminescent layer.

<9> The organic EL device according to <8>, wherein the red primary luminescent layer, the green primary luminescent layer, and the blue primary luminescent layer each independently comprise a luminescent material and a host material, and wherein in each of the luminescent layers, the concentration of the luminescent material in the blue primary luminescent layer is at least twice as high as the concentration of the luminescent material in the red primary luminescent layer.

<10> The organic EL device according to <8>, wherein in each of the luminescent layers, the red primary luminescent layer, the green primary luminescent layer, and the blue primary luminescent layer each independently comprise a luminescent material and a host material, the thickness of the blue primary luminescent layer is at least twice as thick as the red primary luminescent layer, and the concentration of the luminescent material in the blue primary luminescent layer is at least twice as high as the concentration of the luminescent material in the red primary luminescent layer.

<11> The organic EL device according to <5>, wherein the luminescent material comprises a metal complex that emits phosphorescent light.

EXAMPLES

In the following, the invention will be described with reference to the Examples. However, the invention is not limited thereto.

1. Preparation of Organic EL Device.

(Preparation of Organic EL Device 1)

A glass substrate on which indium tin oxide (ITO) is evaporated to a thickness of 100 nm (thickness: 0.5 mm, 2.5 cm×2.5 cm, surface resistance: 10 Ω/square, manufactured by Geomatec Corporation) was placed in a washing container and subjected to ultrasonic washing using 2-propanol, and subsequently a UV-ozone treatment for 30 minutes. Then, the following layers were formed on the thus produced transparent anode. Each layer was formed by vacuum evaporation. The evaporation rate conducted in the Examples was 0.2 nm/seconds, unless otherwise specified. The evaporation rate was measured using a quartz oscillator, and the thickness of the following layers were also measured using a quarts oscillator.

Hole-injection layer: 4,4',4"-tris(2-naphthylphenylamino)triphenylamine (2-TNATA) was evaporated to a thickness of 150 nm.

Hole-transporting layer: N,N'-dinaphthyl-N,N'-diphenyl-[1,1'-biphenyl]-4,4'-diamine (α-NPD) was evaporated to a thickness of 20 nm.

A luminescent portion was formed by layering six units of luminescent layer. Each unit includes a blue primary luminescent layer, a green primary luminescent layer, and a red primary luminescent layer, as mentioned below.

Blue primary luminescent layer: 1,3-bis(carbazol-9-yl)benzene (mCP) and blue luminescent material B1 were co-evaporated so that the amount of B1 was 10% by mass with respect to the amount of mCP. The thickness of the layer was 3 nm.

Green primary luminescent layer: mCP and green luminescent material G1 were co-evaporated so that the amount of G1 was 0.5% by mass with respect to the amount of mCP. The thickness of the layer was 1 nm.

Red primary luminescent layer: mCP and red luminescent material R1 were co-evaporated so that the amount of R1 was 0.5% by mass with respect to the amount of mCP. The thickness of the layer was 1 nm.

Subsequently, the following electron-transporting layer and electron-injection layer were formed on the luminescent portion.

Electron-transporting layer: bis-(2-methyl-8-quinolinolate)-4-(phenylphenolate)aluminum (BAlq) was evaporated to a thickness of 40 nm.

Electron-injection layer: LiF was evaporated to a thickness of 1 nm.

Thereafter, a cathode having a thickness of 100 nm was formed from Al by performing patterning using a shadow mask.

Each of the aforementioned layers were formed by resistance heating vacuum evaporation.

The layer structure as prepared above was placed in a glove box purged with a nitrogen gas, and this was sealed using a sealing can to which a drying agent for organic EL device was attached, and a UV-curable adhesive (trade name: XNR5516HV, manufactured by Nagase ChemteX Corporation).

(Preparation of Organic EL Device 2)

Organic EL device 2 was prepared in a similar manner to organic EL device 1, except that the luminescent portion was formed by layering eight units of luminescent layer. Each unit includes a blue primary luminescent layer, a green primary luminescent layer, and a red primary luminescent layer, as mentioned below.

Blue primary luminescent layer: mCP and blue luminescent material B1 were co-evaporated so that the amount of B1 was 15% by mass with respect to the amount of mCP. The thickness of the layer was 2 nm.

Green primary luminescent layer: mCP and green luminescent material G1 were co-evaporated so that the amount of G1 was 0.5% by mass with respect to the amount of mCP. The thickness of the layer was 1 nm.

Red primary luminescent layer: mCP and red luminescent material R1 were co-evaporated so that the amount of R1 was 0.5% by mass with respect to the amount of mCP. The thickness of the layer was 1 nm.

(Preparation of Organic EL Device 3)

Organic EL device 3 was prepared in a similar manner to organic EL device 1, except that the luminescent portion was formed by layering three units of luminescent layer. Each unit includes a blue primary luminescent layer, a green primary luminescent layer, and a red primary luminescent layer, as mentioned below.

Blue primary luminescent layer: mCP and blue luminescent material B1 were co-evaporated so that the amount of B1 was 15% by mass with respect to the amount of mCP. The thickness of the layer was 5 nm.

Green primary luminescent layer: mCP and green luminescent material G1 were co-evaporated so that the amount of G1 was 1% by mass with respect to the amount of mCP. The thickness of the layer was 2 nm.

Red primary luminescent layer: mCP and red luminescent material R1 were co-evaporated so that the amount of R1 was 1% by mass with respect to the amount of mCP. The thickness of the layer was 2 nm.

(Preparation of Organic EL Device 4)

Organic EL device 4 was prepared in a similar manner to organic EL device 1, except that the luminescent portion was formed by layering six units of luminescent layer. Each unit includes a blue primary luminescent layer, a green primary luminescent layer, and a red primary luminescent layer, as mentioned below.

Blue primary luminescent layer: N,N'-di-carbazolyl-4,4'-biphenyl (CBP) and FIrpic were co-evaporated so that the amount of FIrpic was 10% by mass with respect to the amount of CBP. The thickness of the layer was 3 nm.

Green primary luminescent layer: CBP and Ir(ppy)$_3$ were co-evaporated so that the amount of Ir(ppy)$_3$ was 0.5% by mass with respect to the amount of CBP. The thickness of the layer was 1 nm.

Red primary luminescent layer: CBP and PtOEP were co-evaporated so that the amount of PtOEP was 0.5% by mass with respect to the amount of CBP. The thickness of the layer was 1 nm.

(Preparation of Organic EL Device 5)

Organic EL device 5 was prepared in a similar manner to organic EL device 1, except that the luminescent portion was formed by layering six units of luminescent layer. Each unit includes a blue primary luminescent layer, a green primary luminescent layer, and a red primary luminescent layer, as mentioned below.

Blue primary luminescent layer: CBP and FIrpic were co-evaporated so that the amount of FIrpic was 15% by mass with respect to the amount of CBP. The thickness of the layer was 2 nm.

Green primary luminescent layer: CBP and Ir(ppy)$_3$ were co-evaporated so that the amount of Ir(ppy)$_3$ was 0.5% by mass with respect to the amount of CBP. The thickness of the layer was 1 nm.

Red primary luminescent layer: CBP and PtOEP were co-evaporated so that the amount of PtOEP was 0.5% by mass with respect to the amount of CBP. The thickness of the layer was 1 nm.

(Preparation of Organic EL Device 6)

Organic EL device 6 was prepared in a similar manner to organic EL device 1, except that the luminescent portion was formed by layering three units of luminescent layer. Each unit includes a blue primary luminescent layer, a green primary luminescent layer, and a red primary luminescent layer, as mentioned below.

Blue primary luminescent layer: CBP and FIrpic were co-evaporated so that the amount of FIrpic was 15% by mass with respect to the amount of CBP. The thickness of the layer was 5 nm.

Green primary luminescent layer: CBP and Ir(ppy)$_3$ were co-evaporated so that the amount of Ir(ppy)$_3$ was 1% by mass with respect to the amount of CBP. The thickness of the layer was 2 nm.

Red primary luminescent layer: CBP and PtOEP were co-evaporated so that the amount of PtOEP was 1% by mass with respect to the amount of CBP. The thickness of the layer was 2 nm.

(Preparation of Organic EL Device 7)

Organic EL device 7 was prepared in a similar manner to organic EL device 1, except that the luminescent portion was formed by layering ten units of luminescent layer. Each unit includes a blue primary luminescent layer, a green primary luminescent layer, and a red primary luminescent layer, as mentioned below.

Blue primary luminescent layer: mCP and B1 were co-evaporated so that the amount of B1 was 15% by mass with respect to the amount of mCP. The thickness of the layer was 1 nm.

Green primary luminescent layer: mCP and G1 were co-evaporated so that the amount of G1 was 0.15% by mass with respect to the amount of mCP. The thickness of the layer was 1 nm.

Red primary luminescent layer: mCP and R1 were co-evaporated so that the amount of mCP was 0.15% by mass with respect to the amount of mCP. The thickness of the layer was 1 nm.

(Preparation of Organic EL Device 8)

Organic EL device 8 was prepared in a similar manner to organic EL device 1, except that the luminescent portion was formed by layering ten units of luminescent layer. Each unit includes a blue primary luminescent layer, a green primary luminescent layer, and a red primary luminescent layer, as mentioned below.

Blue primary luminescent layer: H-27 and B2 were co-evaporated so that the amount of B2 was 15% by mass with respect to the amount of H-27. The thickness of the layer was 2 nm.

Green primary luminescent layer: H-27 and G1 were co-evaporated so that the amount of G1 was 0.5% by mass with respect to the amount of H-27. The thickness of the layer was 1 nm.

Red primary luminescent layer: H-27 and R1 were co-evaporated so that the amount of R1 was 0.5% by mass with respect to the amount of H-27. The thickness of the layer was 1 nm.

(Preparation of Organic EL Device 9)

Organic EL device 9 was prepared in a similar manner to organic EL device 1, except that the luminescent portion was formed by layering six units of luminescent layer. Each unit includes a blue primary luminescent layer, a green primary luminescent layer, and a red primary luminescent layer, as mentioned below.

Blue primary luminescent layer: mCP and blue luminescent material B3 were co-evaporated so that the amount of B3 was 15% by mass with respect to the amount of mCP. The thickness of the layer was 3 nm.

Green primary luminescent layer: mCP and G1 were co-evaporated so that the amount of G1 was 1% by mass with respect to the amount of mCP. The thickness of the layer was 1 nm.

Red primary luminescent layer: mCP and red luminescent material R2 were co-evaporated so that the amount of R2 was 1% by mass with respect to the amount of mCP. The thickness of the layer was 1 nm.

(Preparation of Organic EL Device 10)

Organic EL device 10 was prepared in a similar manner to organic EL device 1, except that the luminescent portion was formed by layering six units of luminescent layer. Each unit includes a blue primary luminescent layer, a green primary luminescent layer, and a red primary luminescent layer, as mentioned below.

Blue primary luminescent layer: mCP and blue luminescent material B4 were co-evaporated so that the amount of B4 was 8% by mass with respect to the amount of mCP. The thickness of the layer was 3 nm.

Green primary luminescent layer: mCP and green luminescent material G2 were co-evaporated so that the amount of G2 was 0.5% by mass with respect to the amount of mCP. The thickness of the layer was 1 nm.

Red primary luminescent layer: mCP and red luminescent material R3 were co-evaporated so that the amount of R3 was 0.5% by mass with respect to the amount of mCP. The thickness of the layer was 1 nm.

(Preparation of Organic EL Device 11)

Organic EL device 11 was prepared in a similar manner to organic EL device 1, except that the luminescent portion was formed by layering six units of luminescent layer. Each unit includes a blue primary luminescent layer, a green primary luminescent layer, and a red primary luminescent layer, as mentioned below.

Blue primary luminescent layer: mCP and blue luminescent material B5 were co-evaporated so that the amount of B5 was 8% by mass with respect to the amount of mCP. The thickness of the layer was 3 nm.

Green primary luminescent layer: mCP and green luminescent material G3 were co-evaporated so that the amount of G3 was 0.5% by mass with respect to the amount of mCP. The thickness of the layer was 1 nm.

Red primary luminescent layer: mCP and red luminescent material R4 were co-evaporated so that the amount of R4 was 0.5% by mass with respect to the amount of mCP. The thickness of the layer was 1 nm.

(Preparation of Comparative Organic EL Device 1)

Comparative organic EL device 1 was prepared in a similar manner to organic EL device 1, except that the luminescent portion was formed from the following three luminescent layers 1 to 3.

Luminescent layer 1: mCP and B1 were co-evaporated so that the amount of B1 was 15% by mass with respect to the amount of mCP. The thickness of the layer was 20 nm.

Luminescent layer 2: mCP and G1 were co-evaporated so that the amount of G1 was 15% by mass with respect to the amount of mCP. The thickness of the layer was 5 nm.

Luminescent layer 3: mCP and R1 were co-evaporated so that the amount of R1 was 5% by mass with respect to the amount of mCP. The thickness of the layer was 5 nm.

(Preparation of Comparative Organic EL Device 2)

Comparative organic EL device 2 was prepared in a similar manner to organic EL device 1, except that the luminescent portion was formed from the following six luminescent layers 1 to 6.

Luminescent layer 1: mCP and B1 were co-evaporated so that the amount of B1 was 15% by mass with respect to the amount of mCP. The thickness of the layer was 10 nm.

Luminescent layer 2: mCP and G1 were co-evaporated so that the amount of G1 was 15% by mass with respect to the amount of mCP. The thickness of the layer was 3 nm.

Luminescent layer 3: mCP and R1 were co-evaporated so that the amount of R1 was 5% by mass with respect to the amount of mCP. The thickness of the layer was 2 nm.

Luminescent layer 4: mCP and B1 were co-evaporated so that the amount of B1 was 15% by mass with respect to the amount of mCP. The thickness of the layer was 10 nm.

Luminescent layer 5: mCP and G1 were co-evaporated so that the amount of G1 was 15% by mass with respect to the amount of mCP. The thickness of the layer was 3 nm.

Luminescent layer 6: mCP and R1 were co-evaporated so that the amount of R1 was 5% by mass with respect to the amount of mCP. The thickness of the layer was 2 nm.

(Preparation of Comparative Organic EL Device 3)

Comparative organic EL device 3 was prepared in a similar manner to organic EL device 1, except that the luminescent portion was formed from the following three luminescent layers 1 to 3.

Luminescent layer 1: CBP and FIrpic were co-evaporated so that the amount of FIrpic was 15% by mass with respect to the amount of CBP. The thickness of the layer was 20 nm.

Luminescent layer 2: CBP and Ir(ppy)$_3$ were co-evaporated so that the amount of Ir(ppy)$_3$ was 15% by mass with respect to the amount of CBP. The thickness of the layer was 5 nm.

Luminescent layer 3: CBP and PtOEP were co-evaporated so that the amount of PtOEP was 5% by mass with respect to the amount of CBP. The thickness of the layer was 5 nm.

(Preparation of Comparative Organic EL Device 4)

Comparative organic EL device 4 was prepared in a similar manner to organic EL device 1, except that the luminescent portion was formed from the following six luminescent layers 1 to 6.

Luminescent layer 1: CBP and FIrpic were co-evaporated so that the amount of FIrpic was 15% by mass with respect to the amount of CBP. The thickness of the layer was 10 nm.

Luminescent layer 2: CBP and Ir(ppy)$_3$ were co-evaporated so that the amount of Ir(ppy)$_3$ was 15% by mass with respect to the amount of CBP. The thickness of the layer was 3 nm.

Luminescent layer 3: CBP and PtOEP were co-evaporated so that the amount of PtOEP was 5% by mass with respect to the amount of CBP. The thickness of the layer was 2 nm.

Luminescent layer 4: CBP and FIrpic were co-evaporated so that the amount of FIrpic was 15% by mass with respect to the amount of CBP. The thickness of the layer was 10 nm.

Luminescent layer 5: CBP and Ir(ppy)$_3$ were co-evaporated so that the amount of Ir(ppy)$_3$ was 15% by mass with respect to the amount of CBP. The thickness of the layer was 3 nm.

Luminescent layer 6: CBP and PtOEP were co-evaporated so that the amount of PtOEP was 5% by mass with respect to the amount of CBP. The thickness of the layer was 2 nm.

(Preparation of Comparative Organic EL Device 5)

Comparative organic EL device 5 was prepared in a similar manner to organic EL device 1, except that the luminescent portion was formed from the following three luminescent layers 1 to 3.

Luminescent layer 1: mCP and B3 were co-evaporated so that the amount of B3 was 15% by mass with respect to the amount of mCP. The thickness of the layer was 20 nm.

Luminescent layer 2: mCP and G1 were co-evaporated so that the amount of G1 was 15% by mass with respect to the amount of mCP. The thickness of the layer was 5 nm.

Luminescent layer 3: mCP and R2 were co-evaporated so that the amount of R2 was 5% by mass with respect to the amount of mCP. The thickness of the layer was 5 nm.

(Preparation of Comparative Organic EL Device 6)

Comparative organic EL device 6 was prepared in a similar manner to organic EL device 1, except that the luminescent portion was formed from the following six luminescent layers 1 to 6.

Luminescent layer 1: mCP and B3 were co-evaporated so that the amount of B3 was 15% by mass with respect to the amount of mCP. The thickness of the layer was 10 nm.

Luminescent layer 2: mCP and G1 were co-evaporated so that the amount of G1 was 15% by mass with respect to the amount of mCP. The thickness of the layer was 3 nm.

Luminescent layer 3: mCP and R2 were co-evaporated so that the amount of R2 was 5% by mass with respect to the amount of mCP. The thickness of the layer was 2 nm.

Luminescent layer 4: mCP and B3 were co-evaporated so that the amount of B3 was 15% by mass with respect to the amount of mCP. The thickness of the layer was 10 nm.

Luminescent layer 5: mCP and G1 were co-evaporated so that the amount of G1 was 15% by mass with respect to the amount of mCP. The thickness of the layer was 3 nm.

Luminescent layer 6: mCP and R2 were co-evaporated so that the amount of R2 was 5% by mass with respect to the amount of mCP. The thickness of the layer was 2 nm.

(Preparation of Comparative Organic EL Device 7)

Comparative organic EL device 7 was prepared in a similar manner to organic EL device 1, except that the luminescent portion was formed from the following three luminescent layers 1 to 3.

Luminescent layer 1: mCP and B4 were co-evaporated so that the amount of B4 was 8% by mass with respect to the amount of mCP. The thickness of the layer was 20 nm.

Luminescent layer 2: mCP and G2 were co-evaporated so that the amount of G2 was 8% by mass with respect to the amount of mCP. The thickness of the layer was 5 nm.

Luminescent layer 3: mCP and R3 were co-evaporated so that the amount of R3 was 4% by mass with respect to the amount of mCP. The thickness of the layer was 5 nm.

(Preparation of Comparative Organic EL Device 8)

Comparative organic EL device 8 was prepared in a similar manner to organic EL device 1, except that the luminescent portion was formed from the following six luminescent layers 1 to 6.

Luminescent layer 1: mCP and B4 were co-evaporated so that the amount of B4 was 8% by mass with respect to the amount of mCP. The thickness of the layer was 10 nm.

Luminescent layer 2: mCP and G2 were co-evaporated so that the amount of G2 was 8% by mass with respect to the amount of mCP. The thickness of the layer was 3 nm.

Luminescent layer 3: mCP and R3 were co-evaporated so that the amount of R3 was 4% by mass with respect to the amount of mCP. The thickness of the layer was 2 nm.

Luminescent layer 4: mCP and B4 were co-evaporated so that the amount of B4 was 15% by mass with respect to the amount of mCP. The thickness of the layer was 10 nm.

Luminescent layer 5: mCP and G2 were co-evaporated so that the amount of G2 was 15% by mass with respect to the amount of mCP. The thickness of the layer was 3 nm.

Luminescent layer 6: mCP and R3 were co-evaporated so that the amount of R3 was 5% by mass with respect to the amount of mCP. The thickness of the layer was 2 nm.

(Preparation of Comparative Organic EL Device 9)

Comparative organic EL device 9 was prepared in a similar manner to organic EL device 1, except that the luminescent portion was formed from the following three luminescent layers 1 to 3.

Luminescent layer 1: mCP and B5 were co-evaporated so that the amount of B5 was 8% by mass with respect to the amount of mCP. The thickness of the layer was 20 nm.

Luminescent layer 2: mCP and G3 were co-evaporated so that the amount of G3 was 8% by mass with respect to the amount of mCP. The thickness of the layer was 5 nm.

Luminescent layer 3: mCP and R4 were co-evaporated so that the amount of R4 was 4% by mass with respect to the amount of mCP. The thickness of the layer was 5 nm.

(Preparation of Comparative Organic EL Device 10)

Comparative organic EL device 10 was prepared in a similar manner to organic EL device 1, except that the luminescent portion was formed from the following six luminescent layers 1 to 6.

Luminescent layer 1: mCP and B5 were co-evaporated so that the amount of B5 was 8% by mass with respect to the amount of mCP. The thickness of the layer was 10 nm.

Luminescent layer 2: mCP and G3 were co-evaporated so that the amount of G3 was 8% by mass with respect to the amount of mCP. The thickness of the layer was 3 nm.

Luminescent layer 3: mCP and R4 were co-evaporated so that the amount of R4 was 4% by mass with respect to the amount of mCP. The thickness of the layer was 2 nm.

Luminescent layer 4: mCP and B5 were co-evaporated so that the amount of B5 was 8% by mass with respect to the amount of mCP. The thickness of the layer was 10 nm.

Luminescent layer 5: mCP and G3 were co-evaporated so that the amount of G3 was 8% by mass with respect to the amount of mCP. The thickness of the layer was 3 nm.

Luminescent layer 6: mCP and R4 were co-evaporated so that the amount of R4 was 4% by mass with respect to the amount of mCP. The thickness of the layer was 2 nm.

The following are the structures of the compounds used in the aforementioned organic EL devices.

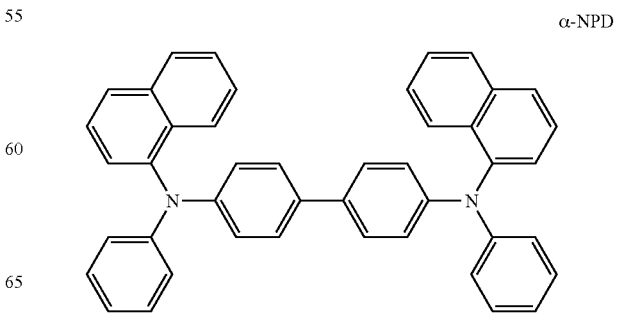

2-TNATA
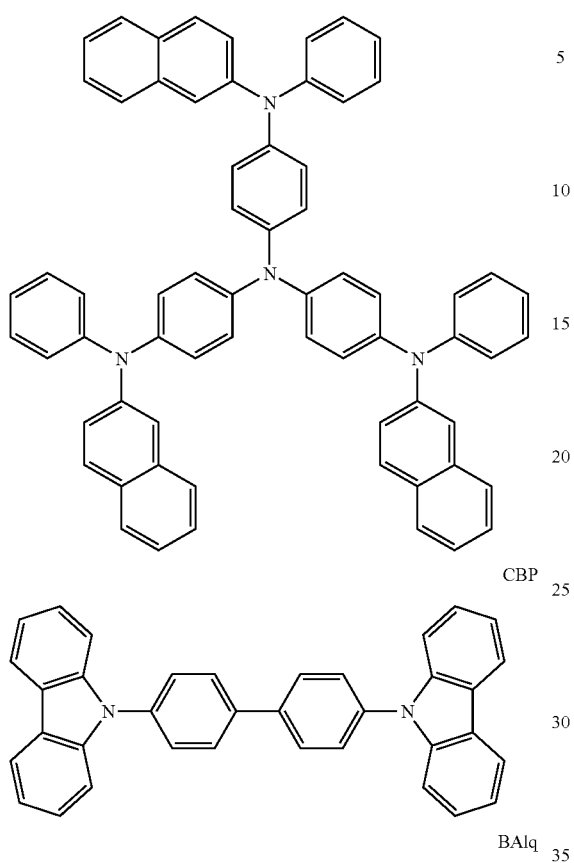
Ir(ppy)₃
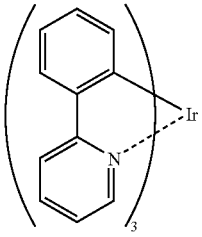
PtOEP
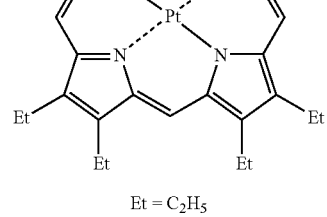
Et = C₂H₅
B1
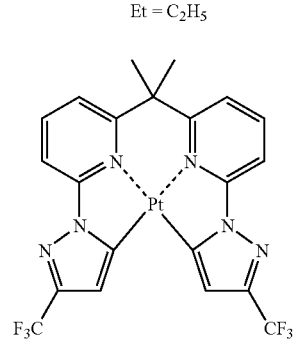
CBP
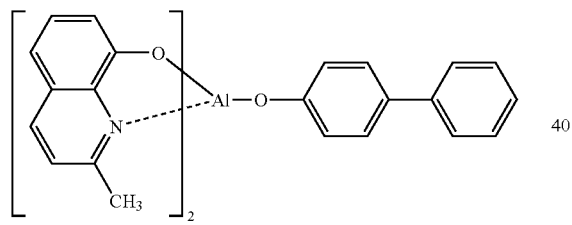
BAlq
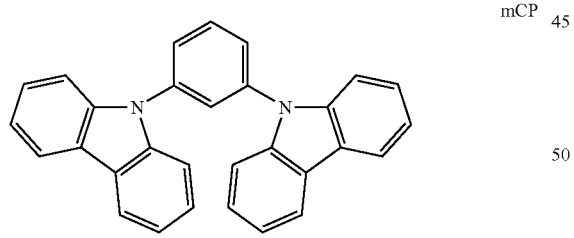
G1
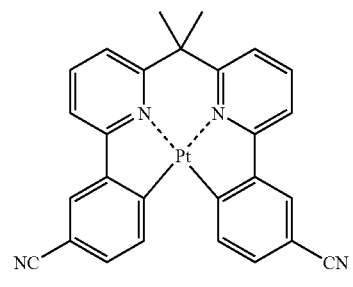
mCP
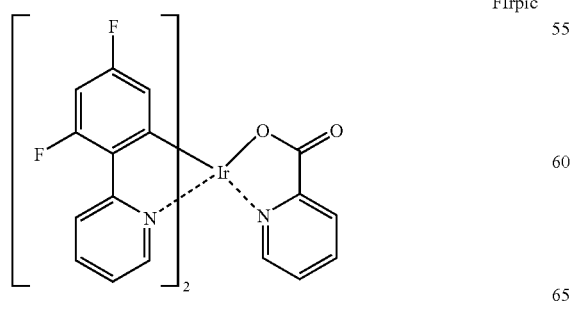
FIrpic -continued
B2
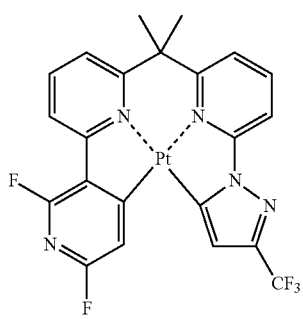
H-27
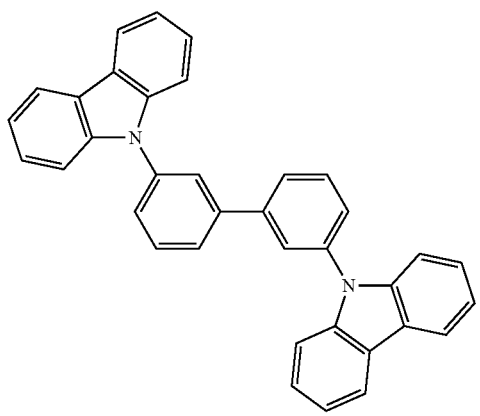
B3
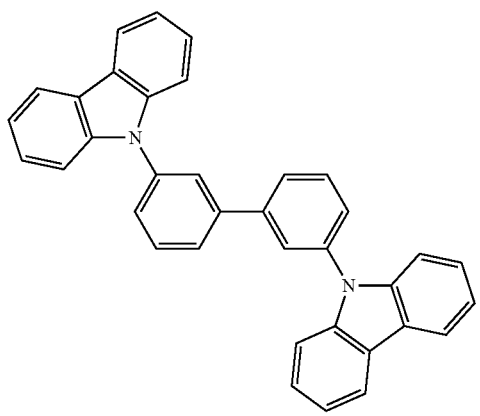
R2
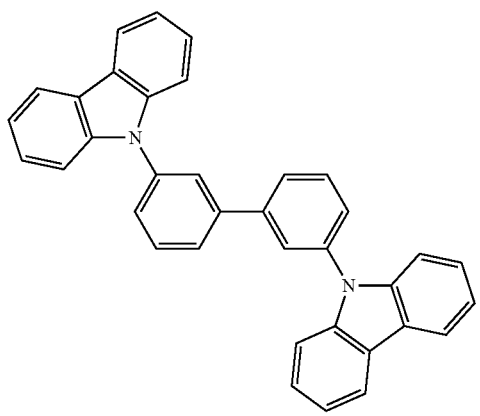
-continued
B4
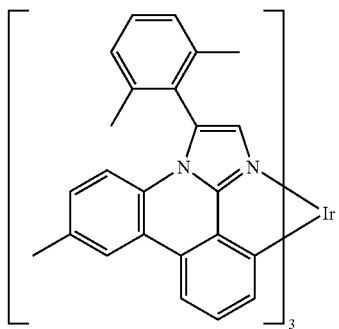
G2
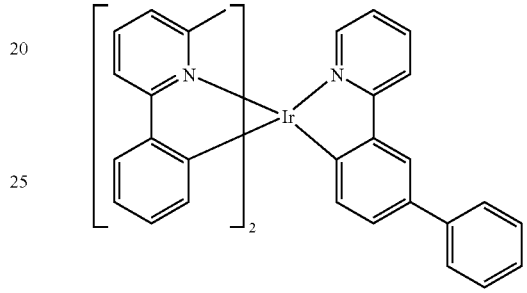
R3
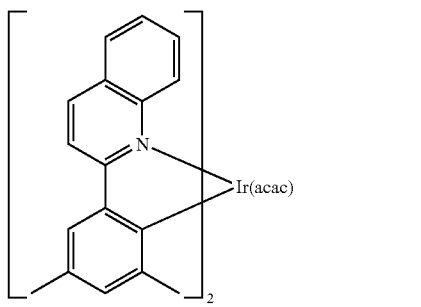
B5
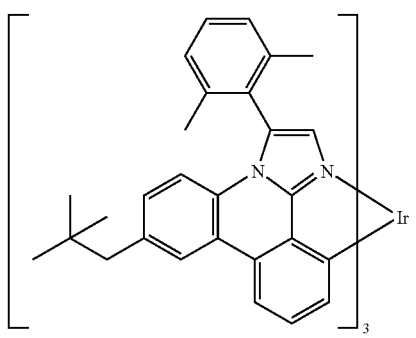
G3
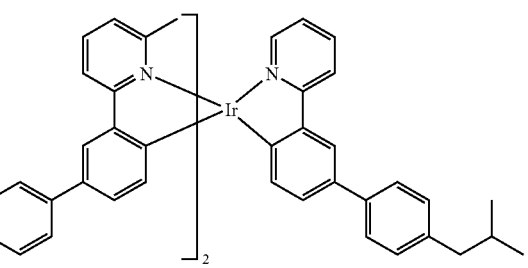

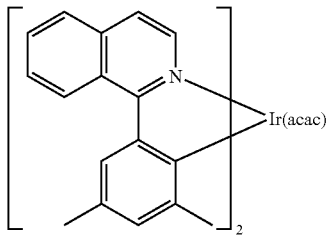

2. Evaluation of Properties

The following evaluation was conducted using the organic EL devices 1 to 11 (the invention) and the comparative organic EL devices 1 to 10.

<Evaluation of Color Deviation>

The color of light emitted from the organic EL device was converted to a numerical value using a CIE UCS diagram (uniform chromaticity scale diagram). This color system expresses a color by means of a chromaticity coordinate (u', v') obtained from a u' v' chromaticity diagram, based on an RGB additive color system (details thereof are described on page 609 of *Basics of Photographic Technology—Silver Halide Photography Edition*—, the Society of Photographic Science and Technology of Japan (1998), ISBN: 978-4-339-06591-6).

The color deviation was evaluated by the value Δuv obtained by the following Expression 1, where $(u_1, v_1)$ refers to a u' v' chromaticity coordinate when the device emits light at 10 cd/m², and $(u_2, v_2)$ refers to a u' v' chromaticity coordinate when the device emits light at 10,000 cd/m².

$$\Delta uv = \sqrt{(u_1-u_2)^2+(v_1-v_2)^2} \quad \text{Expression 1}$$

The chromaticity coordinate (x, y) is converted to a u' v' coordinate according to the following Expression 2.

$$u' = \frac{4x}{-2x+12y+3}, v' = \frac{9y}{-2x+12y+3} \quad \text{Expression 2}$$

The obtained results are shown in Table 1.

TABLE 1

| Organic EL device No. | Color of light | Color deviation (Δuv) |
| --- | --- | --- |
| Organic EL device 1 | White | 0.016 |
| Organic EL device 2 | White | 0.015 |
| Organic EL device 3 | White | 0.028 |
| Organic EL device 4 | White | 0.020 |
| Organic EL device 5 | White | 0.019 |
| Organic EL device 6 | White | 0.030 |
| Organic EL device 7 | White | 0.013 |
| Organic EL device 8 | White | 0.016 |
| Organic EL device 9 | White | 0.015 |
| Organic EL device 10 | White | 0.017 |
| Organic EL device 11 | White | 0.018 |
| Comparative organic EL device 1 | White | 0.041 |
| Comparative organic EL device 2 | White | 0.039 |
| Comparative organic EL device 3 | White | 0.041 |
| Comparative organic EL device 4 | White | 0.040 |
| Comparative organic EL device 5 | White | 0.040 |
| Comparative organic EL device 6 | White | 0.037 |
| Comparative organic EL device 7 | White | 0.042 |
| Comparative organic EL device 8 | White | 0.040 |
| Comparative organic EL device 9 | White | 0.042 |
| Comparative organic EL device 10 | White | 0.041 |

As shown in Table 1, the values of Δuv, which is an indicator of color deviation, of the organic EL devices according to the invention are as small as 0.03 or less, as compared with the cases of the comparative organic EL devices. Therefore, the organic EL devices according to the invention achieve a suppressed degree of color deviation when the brightness is changed by changing the voltage.

All publications, patent applications, and technical standards mentioned in this specification are herein incorporated by reference to the same extent as if each individual publication, patent application, or technical standard was specifically and individually indicated to be incorporated by reference.

What is claimed is:

1. An organic EL device comprising an anode, a cathode, and a luminescent portion positioned between the anode and cathode, the luminescent portion comprising two or more luminescent layers, each of the luminescent layers comprising plural primary luminescent layers that emit light of different colors, and each of the primary luminescent layers having a thickness of 5 nm or less, wherein the primary luminescent layers each independently comprise a luminescent material and a host material, and in each of the luminescent layers, the concentration of a luminescent material that emits light of the shortest wavelength in a primary luminescent layer including the luminescent material that emits light of the shortest wavelength is at least twice as high as the concentration of a luminescent material that emits light of the longest wavelength in a primary luminescent layer including the luminescent material that emits light of the longest wavelength.

2. The organic EL device according to claim 1, wherein in each of the luminescent layers, the primary luminescent layers that emit light of different colors are adjacent to each other.

3. The organic EL device according to claim 1, wherein the luminescent portion emits white light by mixing the colors of light emitted from the primary luminescent layers.

4. The organic EL device according to claim 1, wherein in each of the luminescent layers, the primary luminescent layer comprising the luminescent material that emits light of the shortest wavelength is at least twice as thick as the primary luminescent layer comprising the luminescent material that emits light of the longest wavelength.

5. The organic EL device according to claim 1, wherein the luminescent portion comprises four or more luminescent layers each comprising plural primary luminescent layers that emit light of different colors.

6. The organic EL device according to claim 1, wherein the primary luminescent layers in each of the luminescent layers comprise a red primary luminescent layer, a green primary luminescent layer, and a blue primary luminescent layer.

7. The organic EL device according to claim 1, wherein the luminescent material comprises a metal complex that emits phosphorescent light.

8. An organic EL device comprising an anode, a cathode, and a luminescent portion positioned between the anode and cathode, the luminescent portion comprising two or more luminescent layers, each of the luminescent layers comprising plural primary luminescent layers that emit light of different colors, and each of the primary luminescent layers having a thickness of 5 nm or less, wherein in each of the luminescent layers, a primary luminescent layer comprising a luminescent material that emits light of the shortest wavelength is at least twice as thick as a primary luminescent layer comprising a luminescent material that emits light of the longest wavelength; and wherein in each of the luminescent layers, the concentration of the luminescent material that emits light of the shortest wavelength in the primary luminescent layer including the luminescent material that emits light of the shortest wavelength is at least twice as high as the concentration of the luminescent material that emits light of the longest wavelength in the primary luminescent layer including the luminescent material that emits light of the longest wavelength.

9. An organic EL device comprising an anode, a cathode, and a luminescent portion positioned between the anode and cathode, the luminescent portion comprising two or more luminescent layers, each of the luminescent layers comprising plural primary luminescent layers that emit light of different colors, and each of the primary luminescent layers having a thickness of 5 nm or less, wherein, in each of the luminescent layers, the primary luminescent layers comprise a red primary luminescent layer, a green primary luminescent layer, and a blue primary luminescent layer, the red primary luminescent layer, the green primary luminescent layer, and the blue primary luminescent layer each independently comprise a luminescent material and a host material, and the concentration of a luminescent material in the blue primary luminescent layer is at least twice as high as the concentration of a luminescent material in the red primary luminescent layer.

10. The organic EL device according to claim 9, wherein in each of the luminescent layers,
the thickness of the blue primary luminescent layer is at least twice as thick as the red primary luminescent layer.

11. The organic EL device according to claim 9, wherein in each of the luminescent layers, the primary luminescent layers that emit light of different colors are adjacent to each other.

12. The organic EL device according to claim 9, wherein the luminescent portion emits white light by mixing the colors of light emitted from the primary luminescent layers.

13. The organic EL device according to claim 9, wherein the luminescent portion comprises four or more luminescent layers each comprising plural primary luminescent layers that emit light of different colors.

14. The organic EL device according to claim 9, wherein the luminescent material comprises a metal complex that emits phosphorescent light.

* * * * *